United States Patent
Nakano et al.

(10) Patent No.: US 10,355,212 B2
(45) Date of Patent: Jul. 16, 2019

(54) POLYMER AND SOLAR CELL USING THE SAME

(71) Applicant: Kabushiki Kaisha Toshiba, Minato-ku (JP)

(72) Inventors: Yoshihiko Nakano, Yokohama (JP);
Shigehiko Mori, Kawasaki (JP);
Takeshi Gotanda, Yokohama (JP);
Fumihiko Aiga, Yokohama (JP);
Rumiko Hayase, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 110 days.

(21) Appl. No.: 15/249,826

(22) Filed: Aug. 29, 2016

(65) Prior Publication Data
US 2016/0372674 A1  Dec. 22, 2016

Related U.S. Application Data

(63) Continuation of application No. PCT/JP2015/001421, filed on Mar. 13, 2015.

(30) Foreign Application Priority Data

Mar. 24, 2014  (JP) ................. 2014-060063

(51) Int. Cl.
*H01L 31/00* (2006.01)
*H01L 51/00* (2006.01)
(Continued)

(52) U.S. Cl.
CPC ........ *H01L 51/0036* (2013.01); *C08G 61/126* (2013.01); *C08K 3/04* (2013.01);
(Continued)

(58) Field of Classification Search
None
See application file for complete search history.

(56) References Cited

U.S. PATENT DOCUMENTS

2008/0061685 A1  3/2008  Chesterfield
2011/0042661 A1  2/2011  Endo et al.
(Continued)

FOREIGN PATENT DOCUMENTS

CN  101945925  1/2011
EP  1 892 776 A2  2/2008
(Continued)

OTHER PUBLICATIONS

Xu et al., "Tuning the Polarizability in Donor Polymers with a Thiophenesaccharin Unit for Organic Photovoltaic Applications," Adv. Funct. Mater. 2014, 24, 3432-3437. (Year: 2014).*

(Continued)

*Primary Examiner* — Angelo Trivisonno
(74) *Attorney, Agent, or Firm* — Oblon, McClelland, Maier & Neustadt, L.L.P.

(57) ABSTRACT

In one embodiment, a polymer includes a recurring unit containing a bivalent group expressed by a formula (1) shown below. A weight-average molecular weight of the polymer is in a range of 3000 or more to 1000000 or less.

(1)

(Continued)

...(6)

R1 is a monovalent group selected from hydrogen, a substituted or unsubstituted alkyl group, a substituted or unsubstituted alkanoyl group, a substituted or unsubstituted aryl group, and a substituted or unsubstituted heteroaryl group. X is an atom selected from oxygen, sulfur, and selenium. Y and Z are each independently a bivalent group selected from a carbonyl group, a sulfinyl group, and a sulfonyl group. A case where Y and Z are both the carbonyl groups is excluded.

9 Claims, 2 Drawing Sheets

(51) Int. Cl.
    *C08K 3/04*     (2006.01)
    *C08G 61/12*     (2006.01)
    *C08L 65/00*     (2006.01)
    *H01L 51/42*     (2006.01)
    *H01L 31/032*     (2006.01)
    *H01L 31/0256*     (2006.01)
    *C08L 75/04*     (2006.01)

(52) U.S. Cl.
    CPC ...... *H01L 51/0037* (2013.01); *H01L 51/0043* (2013.01); *H01L 51/0047* (2013.01); *H01L 51/0077* (2013.01); *H01L 51/0093* (2013.01); *H01L 51/0094* (2013.01); *C08G 2261/124* (2013.01); *C08G 2261/146* (2013.01); *C08G 2261/149* (2013.01); *C08G 2261/1412* (2013.01); *C08G 2261/18* (2013.01); *C08G 2261/228* (2013.01); *C08G 2261/312* (2013.01); *C08G 2261/3223* (2013.01); *C08G 2261/3243* (2013.01); *C08G 2261/3244* (2013.01); *C08G 2261/3246* (2013.01); *C08G 2261/344* (2013.01); *C08G 2261/91* (2013.01); *C08L 65/00* (2013.01); *C08L 75/04* (2013.01); *H01L 31/0324* (2013.01); *H01L 51/0053* (2013.01); *H01L 51/4253* (2013.01); *H01L 2031/0344* (2013.01); *Y02E 10/549* (2013.01)

(56) References Cited

U.S. PATENT DOCUMENTS

| 2011/0178255 A1 | 7/2011 | Wigglesworth et al. |
| 2011/0204341 A1* | 8/2011 | Brown ............... C07D 487/04 257/40 |
| 2012/0049177 A1 | 3/2012 | Chesterfield |
| 2014/0051827 A1 | 2/2014 | Endo et al. |
| 2014/0124710 A1 | 5/2014 | Izawa et al. |
| 2014/0196787 A1 | 7/2014 | Hanaki et al. |

FOREIGN PATENT DOCUMENTS

| EP | 2 270 069 A1 | 1/2011 |
| JP | 2008-98615 | 4/2008 |
| JP | 2011-151396 | 8/2011 |
| JP | 2011-168747 | 9/2011 |
| JP | 2013-504209 | 2/2013 |
| JP | 2013-74137 | 4/2013 |
| JP | 2013-128001 | 6/2013 |
| JP | 2013-189602 | 9/2013 |
| JP | 2014-31508 A | 2/2014 |
| JP | 2014-218669 | 11/2014 |
| KR | 10-2008-0018834 A | 2/2008 |
| KR | 10-2010-0111718 | 10/2010 |
| TW | 200818566 | 4/2008 |
| TW | 200942564 A1 | 10/2009 |
| TW | 201302842 A1 | 1/2013 |
| WO | WO 2008/024380 A2 | 2/2008 |
| WO | WO 2009/102027 A1 | 8/2009 |

OTHER PUBLICATIONS

English translation of the International Preliminary Report on Patentability and Written Opinion dated Oct. 6, 2016 in PCT/JP2015/001421.
A.D. Schlüter, The Tenth Anniversary of Suzuki Polycondensation (SPC), Journal of Polymer Science: Part A: Polymer Chemistry, vol. 39, (2001), pp. 1533-1556.
Jin Young Kim, et al., "New Architecture for High-Efficiency Polymer Photovoltaic Cells Using Solution-Based Titanium Oxide as an Optical Spacer," Advanced Materials, (2006), 18, pp. 572-576.
C. Jeffrey Brinker, et al., "The Physics and Chemistry of Sol-Gel Processing," Sol-Gel Science, Academic Press, (1990), pp. 236-285 plus Front Cover.
Lijun Huo, et al., "Replacing Alkoxy Groups with Alkylthienyl Groups: A Feasible Approach to Improve the Properties of Photovoltaic Polymers," Agnew. Chem. Int. Ed., 50, (2011), pp. 9697-9702.
Phillip A. Rossy, et al., "Aromatization of Dihydrothiophenes. Thiophenesaccharin: A Sweet Surprise," J. Org. Chem., 45, (1980), pp. 617-620.
Chad M Amb, et al., "Dithienogermole As a Fused Electron Donor in Bulk Heterojunction Solar Cells," Journal of the American Chemical Society, 133, (2011), pp. 10062-10065.
Zhengguo Zhu, et al., "Panchromatic Conjugated Polymers Containing Alternating Donor/Acceptor Units for Photovoltaic Application," Macromolecules, 40, (2007), pp. 1981-1986.
International Search Report dated Jun. 2, 2015 in PCT/JP2015/001421, filed on Mar. 13, 2015 (with English Translation).
Written Opinion dated Jun. 2, 2015 in PCT/JP2015/001421, filed on Mar. 13, 2015.
Tao Xu et al. "Tuning the Polarizability in Donor Polymers with a Thiophenesaccharin Unit for Organic Photovoltaic Applications", Advanced Functional Materials, 2014, 6 pages.
Combined Taiwanese Office Action and Search Report dated Jul. 19, 2016 in Patent Application No. 104108968 (with English language translation).

* cited by examiner

...(6)

POLYMER AND SOLAR CELL USING THE SAME

CROSS-REFERENCE TO RELATED APPLICATIONS

This application is a continuation of prior International Application No. PCT/JP2015/001421 filed on Mar. 13, 2015, which is based upon and claims the benefit of priority from Japanese Patent Application No. 2014-060063 filed on Mar. 24, 2014; the entire contents of all of which are incorporated herein by reference.

FIELD

Embodiments described herein relate generally to a polymer and a solar cell using the same.

BACKGROUND

An application of an organic semiconductor to a photoelectric conversion element such as an organic thin-film solar cell, an organic/inorganic hybrid solar cell, a light-emitting element, and an optical sensor is expected. In particular, using a high molecular compound as an organic semiconductor material makes it possible to fabricate an active layer by a low-cost coating method. From a viewpoint of energy requirement and an emission reduction of $CO_2$, a solar cell is expected as one of clean energies with a small environmental load, and a demand for this is rapidly increasing. Currently, a silicon-based solar cell is prevailing, but its efficiency is around 15% and it is difficult to reduce its cost. As a solar cell that can be fabricated at low cost, a CdTe solar cell has also been known, but since it uses Cd being a harmful element, it is liable to cause an environmental problem. Under such circumstances, the development of an organic thin-film solar cell and an organic/inorganic hybrid solar cell as a next-generation solar cell that costs low, has high energy conversion efficiency, and is harmless is increasingly expected.

There is a strong demand for improving power generation efficiency of the organic thin-film solar cell in order to put the organic thin-film solar cell into practical use. In order to improve the power generation efficiency, improving an open-circuit voltage (Voc) is important. A value of the open-circuit voltage of the organic thin-film solar cell greatly depends on the combination of an electron donor and an electron acceptor, and it is required to optimize materials used for these. It has been known that the open-circuit voltage of the organic thin-film solar cell correlates with a difference between an energy level of a highest occupied molecular orbit (HOMO) of a p-type material and an energy level of a lowest unoccupied molecular orbit of an n-type material. It is thought that, in an organic thin-film solar cell currently under development, fullerenes such as phenyl-$C_{61}$-butyric acid methyl ester (PCBM) are most suitable as the n-type semiconductor material. An example of a generally used p-type semiconductor material is a conjugate high polymer of polythiophene such as poly (3-hexylthiophene-2,5-diyl) (P3HT).

The open-circuit voltage (Voc) of the organic thin-film solar cell in which PCBM and P3HT are combined is low such as about 0.6 V and is not necessarily satisfactory in view of practical application. A possible method to improve the value of the open-circuit voltage may be to lower the HOMO level of the p-type semiconductor material. In this case, however, a band gap of the p-type semiconductor widens, and light in a long wavelength range cannot be absorbed. That is, light absorption efficiency for a long wavelength side of a visible light range reduces and incident light cannot be effectively used. There is a drawback that, as a result, energy efficiency does not increase. The value of the open-circuit voltage and the absorption of light in the long wavelength range are often in a trade-off relation, and it is difficult to achieve both at a higher level.

As one attempt to improve the value of the open-circuit voltage of the organic thin-film solar cell, using, as the p-type semiconductor material, a polymer in which imide is ring-condensed with thiophene is under consideration. In the organic thin-film solar cell using, as the p-type semiconductor material, the polymer in which imide is ring-condensed with thiophene, the open-circuit voltage improves up to about 0.85 V, but power generation efficiency is 1% or less, and a further improvement is required. Because of these, there is a demand for a p-type semiconductor material that improves a light absorbing property in a long wavelength range while increasing the value of the open-circuit voltage of the organic thin-film solar cell. Further, improvement of a life property in addition to improvement of an open circuit voltage is required of the organic thin film solar cell. In order to improve the life of the organic thin film solar cell, active substances (a donor and an acceptor) excellent in light stability and heat stability are required.

Further, researches have recently been made on an organic/inorganic hybrid solar cell whose energy conversion efficiency is improved by using an organic/inorganic hybrid perovskite compound or an inorganic perovskite compound for a photoelectric conversion layer. In the organic/inorganic hybrid solar cell, polyarylamine or 2,2',7,7'-tetrakis(N,N-di-p-methoxyphenylamine)-9,9'-spirobifluorene(spiro-OMeTAD) is used as a hole transport layer. Further, in order to enhance conversion efficiency, a dopant such as t-butylpyridine (TBP) or bis(trifluoromethanesulfonyl)imidelithium (Li-TFSI) is used. However, since TBP is liquid and Li-TFSI is a hygroscopic substance, there occurs performance deterioration caused by diffusion or dissipation of TBP to the photoelectric conversion layer due to a temperature increase, by absorption of water molecules due to deliquescence of Li-TFSI, and so on. This is a cause to shorten the life of the organic/inorganic hybrid solar cell. It has been also proposed to use P3HT being a p-type material as the hole transport layer, but sufficient power generation efficiency cannot be obtained in this case.

DETAILED DESCRIPTION

Figure 1:
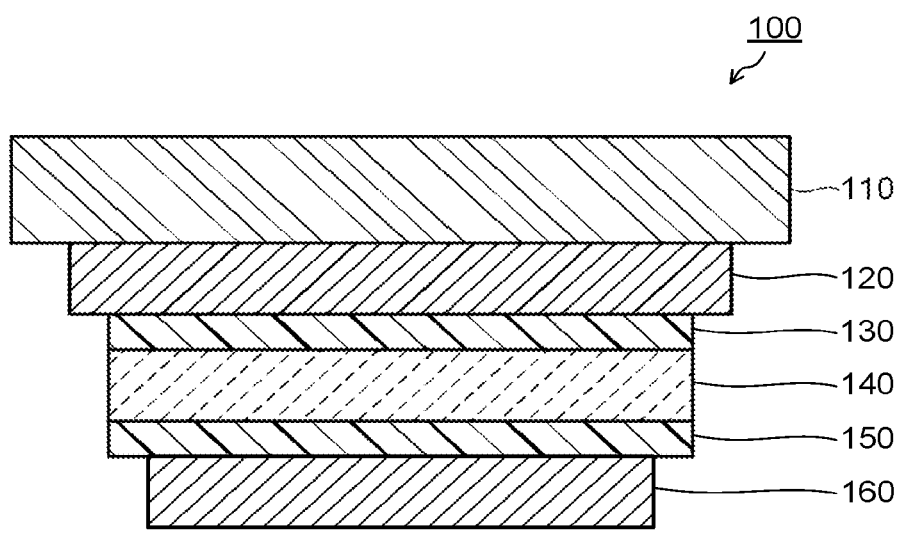
FIG. 1 is a cross-sectional view illustrating a solar cell of an embodiment.
Figure 2:
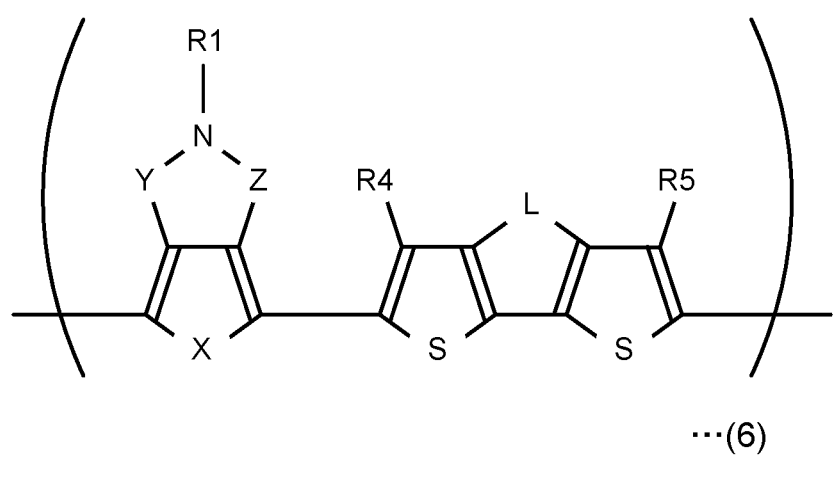
FIG. 2 shows a recurring unit (formula (6)) of a polymer of an embodiment of the present invention

In an embodiment, a polymer includes a recurring unit containing a bivalent group expressed by a formula (1) shown below.

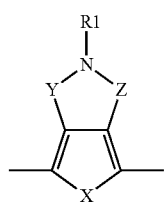

(1)

In the formula (1), R1 is a monovalent group selected from the group consisting of hydrogen, a substituted or unsubstituted alkyl group, a substituted or unsubstituted alkanoyl group, a substituted or unsubstituted aryl group, and a substituted or unsubstituted heteroaryl group. X is an atom selected from the group consisting of oxygen, sulfur, and selenium. Y and Z are each independently a bivalent group selected from the group consisting of a carbonyl group, a sulfinyl group, and a sulfonyl group. Note that a case where Y and Z are both the carbonyl groups is excluded. A weight-average molecular weight of the polymer of the embodiment is within a range of not less than 3000 nor more than 1000000.

Hereinafter, a polymer of an embodiment and a solar cell using the same will be described.

(First Polymer)

A first polymer in the embodiment is an organic high molecular compound which includes a recurring unit expressed by the following formula (2). A weight-average molecular weight of the first polymer is within a range of 3000 to 1000000.

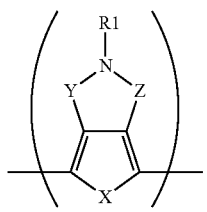

(2)

In the formula (2), R1 is a monovalent group selected from hydrogen, a substituted or unsubstituted alkyl group, a substituted or unsubstituted alkanoyl group, a substituted or unsubstituted aryl group, and a substituted or unsubstituted heteroaryl group. X is an atom selected from oxygen, sulfur, and selenium. Y and Z are each independently a bivalent group selected from a carbonyl group, a sulfinyl group, and a sulfonyl group. Note that the combination of Y and Z excludes a case where the both are the carbonyl groups.

In the R1 group, a carbon number of the substituted or unsubstituted alkyl group is preferably within a range of 1 to 30. The substituted or unsubstituted alkyl group may be linear, branched-linear, or cyclic. Concrete examples of such an alkyl group are a methyl group, an ethyl group, a propyl group, an isopropyl group, a butyl group, a pentyl group, a hexyl group, an octyl group, an isooctyl group, a 2-ethylhexyl group, a nonyl group, a decyl group, a dodecyl group, an octadecyl group, a 2-hexadecyl group, an octadodecyl group, a trifluoromethyl group, a pentafluoroethyl group, a perfluorohexyl group, a perfluorooctyl group, and so on, but the alkyl group is not limited to these.

In the R1 group, a carbon number of the substituted or unsubstituted alkanoyl group is preferably within a range of 1 to 30. The substituted or unsubstituted alkanoyl group may be linear, branched-linear, or cyclic. Concrete examples of such an alkanoyl group are an acetyl group, a propanoyl group, a butanoyl group, a pentanoyl group, a hexanoyl group, an octanoyl group, a 2-etylhexanoyl group, a nonanoyl group, a decanoyl group, a dodecanoyl group, an octadecanoyl group, a 2-hexadecanoyl group, an octadodecl group, a trifluoroacetyl group, a pentafluoropropanoyl group, a perfluorohexanoyl group, a perfluorooctanoyl group, and so on, but the alkanoyl group is not limited to these.

In the R1 group, a carbon number of the substituted or unsubstituted aryl group and heteroaryl group is preferably within a range of 4 to 20. Concrete examples of the aryl group and the heteroaryl group are a phenyl group, a naphthyl group, a 4-biphenyl group, a 2-thienyl group, a 2-furanyl group, a 4-tolyl group, a 4-octylphenyl group, a 2-(5-ethylhexyl)thienyl group, a 2-(5-ethylhexyl)furanyl group, and so on, but they are not limited to these.

X in the formula (2) is an atom selected from oxygen (O), sulfur (S), and selenium (Se). Y and Z are each a bivalent group selected from a carbonyl group (—C(=O)—), a sulfinyl group (—S(=O)—), and a sulfonyl group (—SO$_2$—). Y and Z may be the same groups or may be different groups. The combination in which Y and Z are both the carbonyl groups is excluded. In a composite structure of a hetero five-membered ring containing oxygen, sulfur, or selenium and an imide five-membered ring, according to an organic high molecular compound having a structure in which one carbonyl group of an imide ring is substituted by a sulfinyl group or a sulfonyl group, or a structure in which both carbonyl groups of the imide ring are substituted by sulfinyl groups or sulfonyl groups, it is possible to improve a light absorbing property while increasing an open-circuit voltage value of an organic thin-film solar cell.

In the polymer containing the recurring unit expressed by the formula (2), as the combination of Y and Z, the combination of the carbonyl group and the sulfinyl group, the carbonyl group and the sulfonyl group, the sulfinyl group and the sulfonyl group, the sulfinyl groups, or the sulfonyl groups is employed as described above. Among them, the combination of the carbonyl group and the sulfinyl group and the combination of the carbonyl group and the sulfonyl group are preferable, and the combination of the carbonyl group and the sulfonyl group is more preferable, in consideration of a property as a p-type semiconductor material and fabrication easiness.

A weight-average molecular weight of the polymer containing the recurring unit expressed by the formula (2) is within a range of 3000 to 1000000, and in such a case, good solubility and semiconductor characteristic are obtained. The weight-average molecular weight of the polymer is preferably within a range of 10000 to 600000. The weight-average molecular weight indicates a polystyrene-equivalent weight-average molecular weight measured by a gel permeation chromatography method. Further, in order to impart good solubility to the polymer, the R1 group is preferably a substituted or unsubstituted alkyl group whose carbon number is 6 or more.

The polymer may be constituted by the recurring unit expressed by the formula (2) being bonded in a ring, but the polymer generally contains a terminal group (Rt group). As the terminal group Rt, the same monovalent group as that of R1 described above is employed. The terminal group Rt may be a later-described cross-linking group. The first polymer in the embodiment may be formed only by the recurring unit expressed by the formula (2), or may contain a recurring unit other than that expressed by the formula (2). However, when the number of moles of the recurring unit expressed by the formula (2) is less than 50 mole %, it is not possible to sufficiently obtain the semiconductor characteristic based on the recurring unit expressed by the formula (2). Therefore, a ratio of the formula (2) is preferably 50 mole % or more to the total number of moles of all the recurring units in the polymer.

Concrete examples of the polymer containing the recurring unit expressed by the formula (2) are given below.

However, the first polymer of the embodiment is not limited to the concrete examples given below.
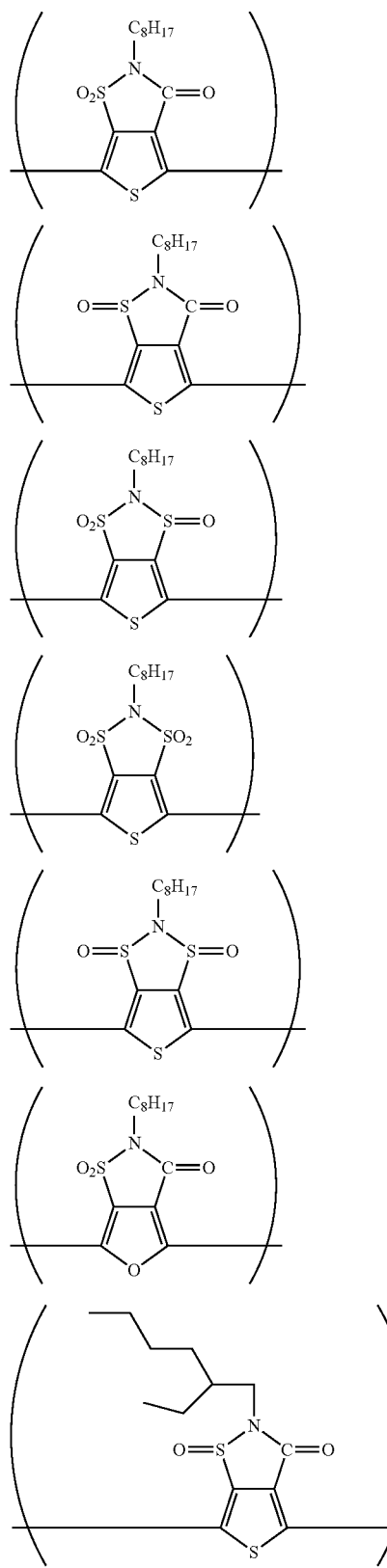

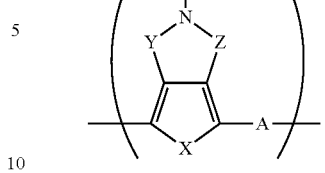

(3)

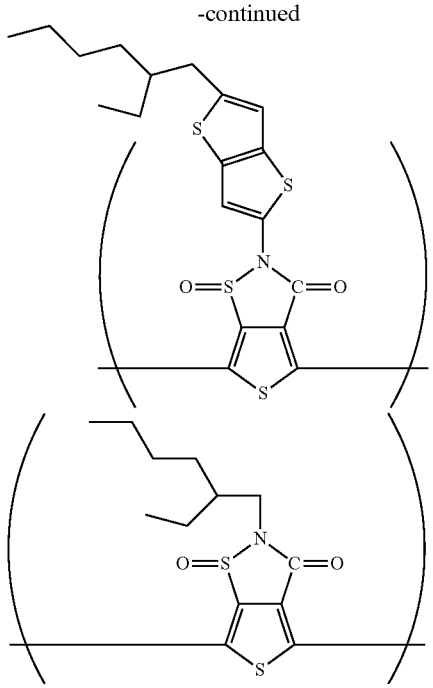

The second polymer including the recurring unit expressed by the formula (3) contains a bivalent conjugated linking group A in addition to the recurring unit expressed by the formula (2). In the recurring unit expressed by the formula (3), the R1 group, X, Y, and Z represent the same substituents or atoms as those in the formula (2), and their concrete examples are also the same. In the recurring unit expressed by the formula (3), the same parts as those in the formula (2) are as described in the first polymer.

Concrete examples of the conjugated linking group A are as follows. However, the conjugated linking group A is not limited to the following concrete examples.

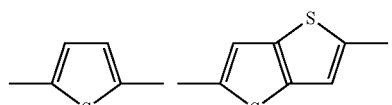

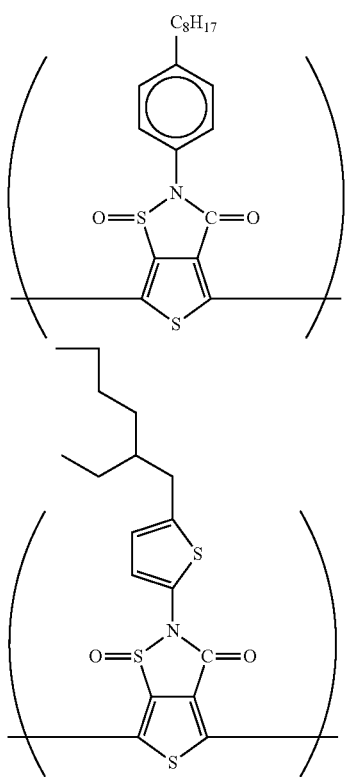

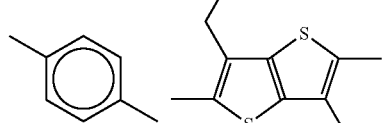

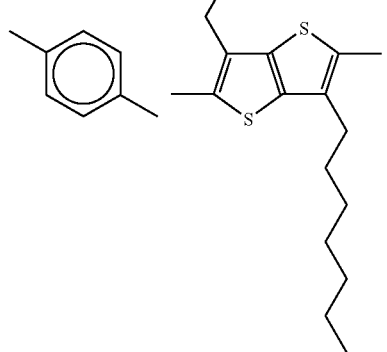

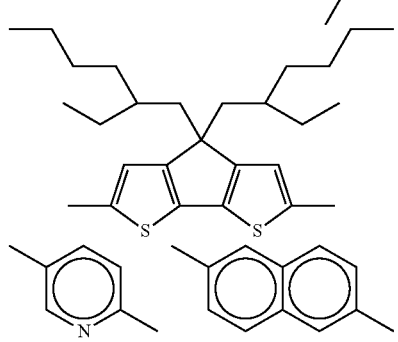

(Second Polymer)

A second polymer in the embodiment is an organic high molecular compound which includes a recurring unit expressed by the following formula (3). A weight-average molecular weight of the second polymer is within a range of 3000 to 1000000.

-continued

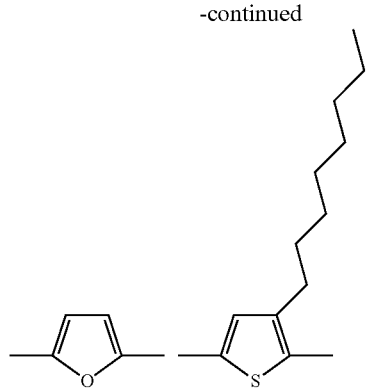

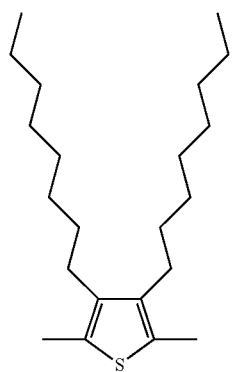

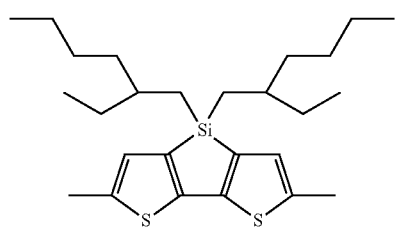

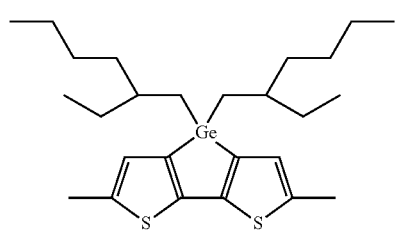

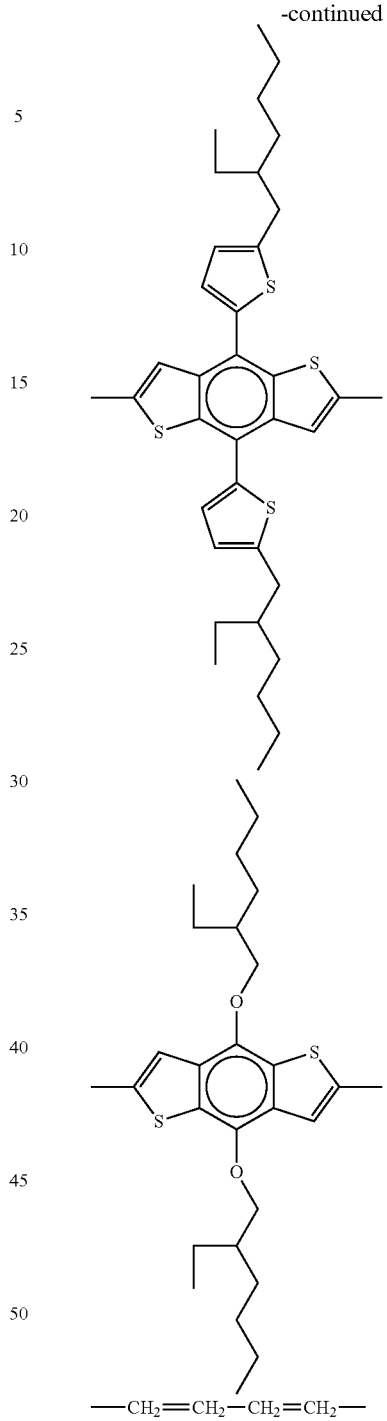

The weight-average molecular weight of the polymer including the recurring unit expressed by the formula (3) is within the range of 3000 to 1000000, and in this case, good solubility and semiconductor characteristic are obtained. The weight-average molecular weight of the polymer is preferably within a range of 10000 to 600000. The polymer may be constituted by the recurring unit expressed by the formula (3) being bonded in a ring, but the polymer generally contains a terminal group Rt. The terminal group Rt is as described previously. The second polymer may be formed only by the recurring unit expressed by the formula (3) or may contain a recurring unit other than that expressed by the formula (3). However, when the number of moles of the recurring unit expressed by the formula (3) is less than 50 mole %, the semiconductor characteristic and so on based on the recurring unit expressed by the formula (3) cannot be sufficiently obtained. Therefore, a ratio of the formula (3) is preferably 50 mole % or more to the total number of moles of all the recurring units in the polymer.

Concrete examples of the polymer including the recurring unit expressed by the formula (3) are given below. However, the second polymer of the embodiment is not limited to the following concrete examples.

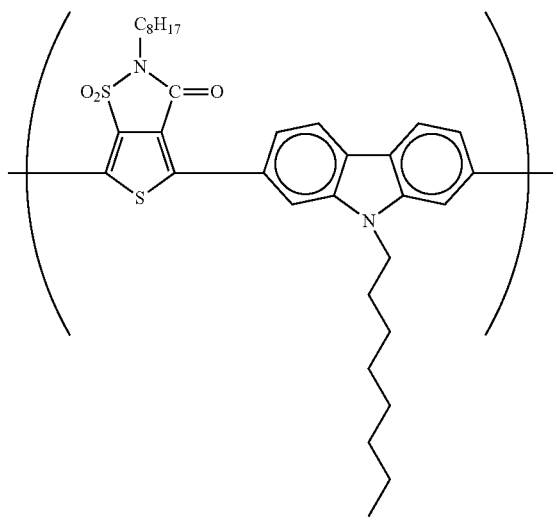

-continued

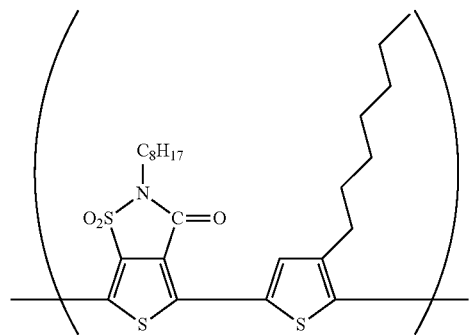

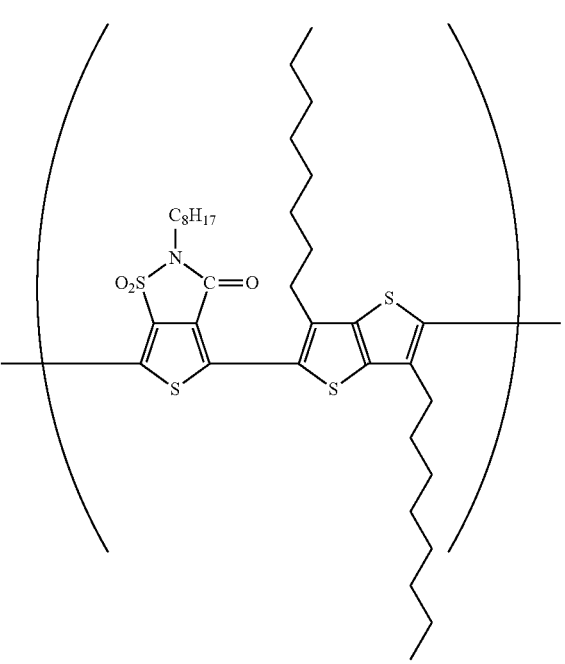

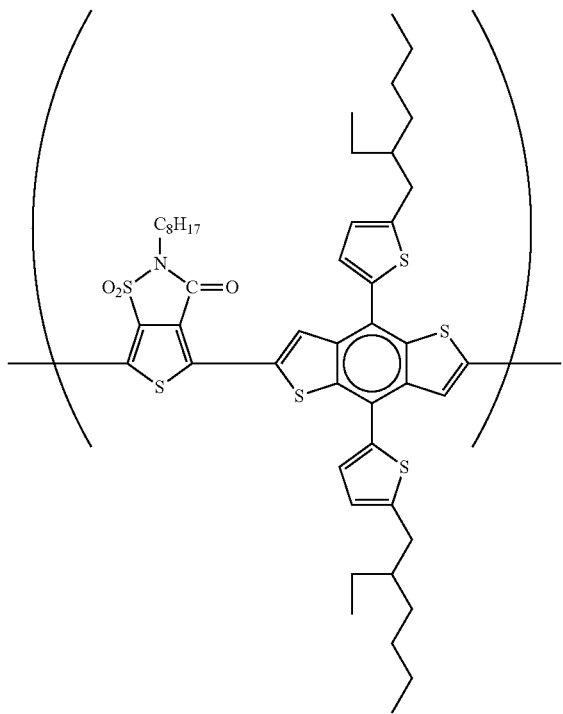

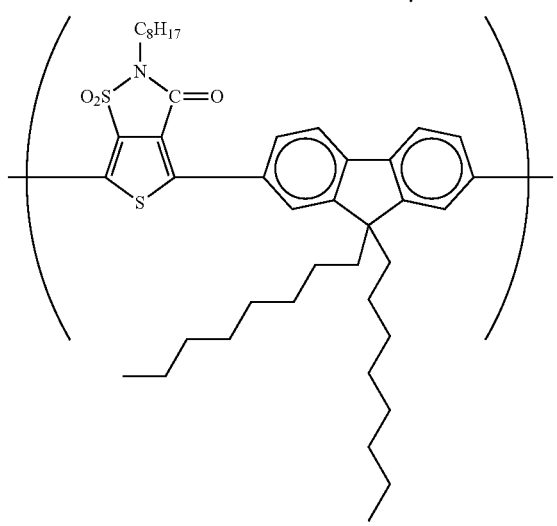

-continued

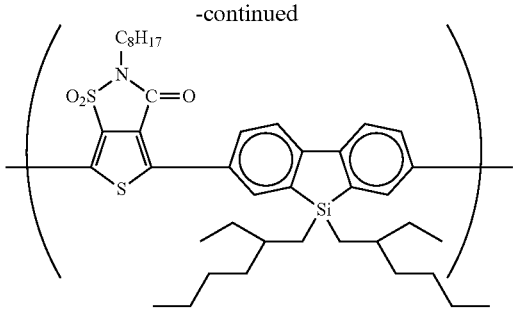

(Third and Fourth Polymers)

A third polymer in the embodiment is an organic high molecular compound which includes a recurring unit expressed by the following formula (4). A weight-average molecular weight of the third polymer is within a range of 3000 to 1000000. A fourth polymer in the embodiment is an organic high molecular compound which includes a recurring unit expressed by the following formula (5). A weight-average molecular weight of the fourth polymer is within a range of 3000 to 1000000.

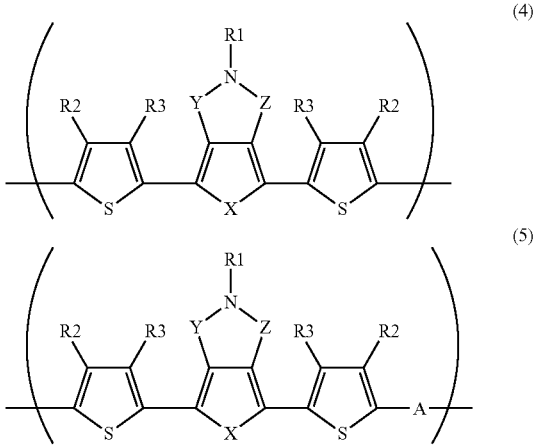

The third polymer includes the recurring unit in which bivalent groups derived from thiophene are bonded to both ends of the recurring unit expressed by the formula (2), as indicated in the formula (4). According to such a recurring unit, long-wavelength light absorption efficiency of the polymer improves. Therefore, power generation efficiency of the solar cell can be further increased. The fourth polymer includes the recurring unit in which a conjugated linking group A is further bonded to one of bivalent groups derived from thiophene as indicated in the formula (5). According to such a recurring unit, since directivity in a three-dimensional structure of the polymer easily becomes uniform, stackability when a cell structure is fabricated improves. Since a current easily flows in the cell structure, power generation efficiency of the solar cell can be further increased.

In the recurring units expressed by the formula (4) and the formula (5), the R1 group, X, Y, Z, and A represent the same substituents or atoms as those in the formula (2) and the formula (3) and their concrete examples are also the same. In the recurring units expressed by the formula (4) and the formula (5), the same parts as those in the formula (2) are as described in the first polymer. The R2 group and the R3 group are each a monovalent group selected from hydrogen, fluorine, a cyano group, a nitro group, a substituted or unsubstituted alkoxycarbonyl group, a substituted or unsubstituted alkyl group, a substituted or unsubstituted alkanoyl group, a substituted or unsubstituted aryl group, and a substituted or unsubstituted heteroaryl group. The R2 group and the R3 group may be the same or may be different. In the R2 group and the R3 group, a carbon number of the substituted or unsubstituted alkyl group and alkanoyl group is preferably within a range of 1 to 30. The substituted or unsubstituted alkyl group and alkanoyl group may be linear, branched-linear, or cyclic. A carbon number of the substituted or unsubstituted aryl group and heteroaryl group is preferably within a range of 4 to 20. Concrete examples of such an alkyl group, an alkanoyl group, an aryl group, and a heteroaryl group are the same as the aforesaid concrete examples of the R1 group.

A carbon number of the substituted or unsubstituted alkoxycarbonyl group is preferably within a range of 1 to 30. The substituted or unsubstituted alkoxycarbonyl group may be linear, branched-linear, or cyclic. Concrete examples of the alkoxycarbonyl group are a methoxycarbonyl group, an ethoxycarbonyl group, a butoxycarbonyl group, a phetyloxycarbonyl group, a hexoxy group, a 2-ethylhexyloxy group, an octyloxycarbonyl group, a decyloxycarbonyl group, a dodecyloxycarbonyl group, an octadecylcarbonyl group, a 2-hexadecyloxycarbonyl group, an octadodecyloxycarbonyl group, a trifluoromethoxycarbonyl group, a pentafluoroethoxycarbonyl group, a perfluorohexyloxycarbonyl group, a perfluorooctyloxycarbonyl group, and so on, but they are not limited to these.

The weight-average molecular weight of the polymers containing the recurring units expressed by the formula (4) and the formula (5) is within the range of 3000 to 1000000, and in this case, good solubility and semiconductor characteristic are obtained. The weight-average molecular weight of the polymers is preferably within a range of 10000 to 600000. The polymer may be constituted by the recurring unit expressed by the formula (4) or (5) by itself bonds in a ring, but the polymer generally contains a terminal group Rt. The terminal group Rt is as described previously. The third and fourth polymers may be formed only by the recurring units expressed by the formula (4) or (5), or may contain a recurring unit other than those expressed by the formula (4) or (5). However, when the number of moles of the recurring units expressed by the formula (4) or (5) is less than 50 mole %, the semiconductor characteristic based on the recurring units expressed by the formula (4) or (5) cannot be sufficiently obtained. Therefore, a ratio of each of the formula (4) and the formula (5) is preferably 50 mole % or more to the total number of moles of all the recurring units in the polymer.

Concrete examples of the polymer including the recurring unit expressed by the formula (4) are given below. However, the third polymer of the embodiment is not limited to the following concrete examples.

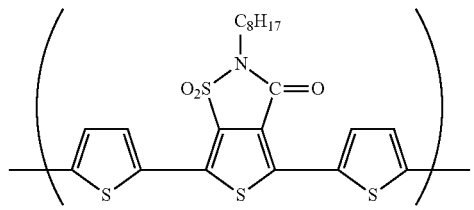

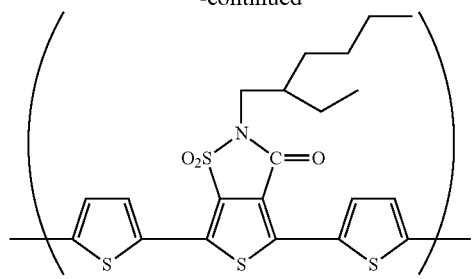
Concrete examples of the polymer including the recurring unit expressed by the formula (5) are given below. However, the fourth polymer of the embodiment is not limited to the following concrete examples.
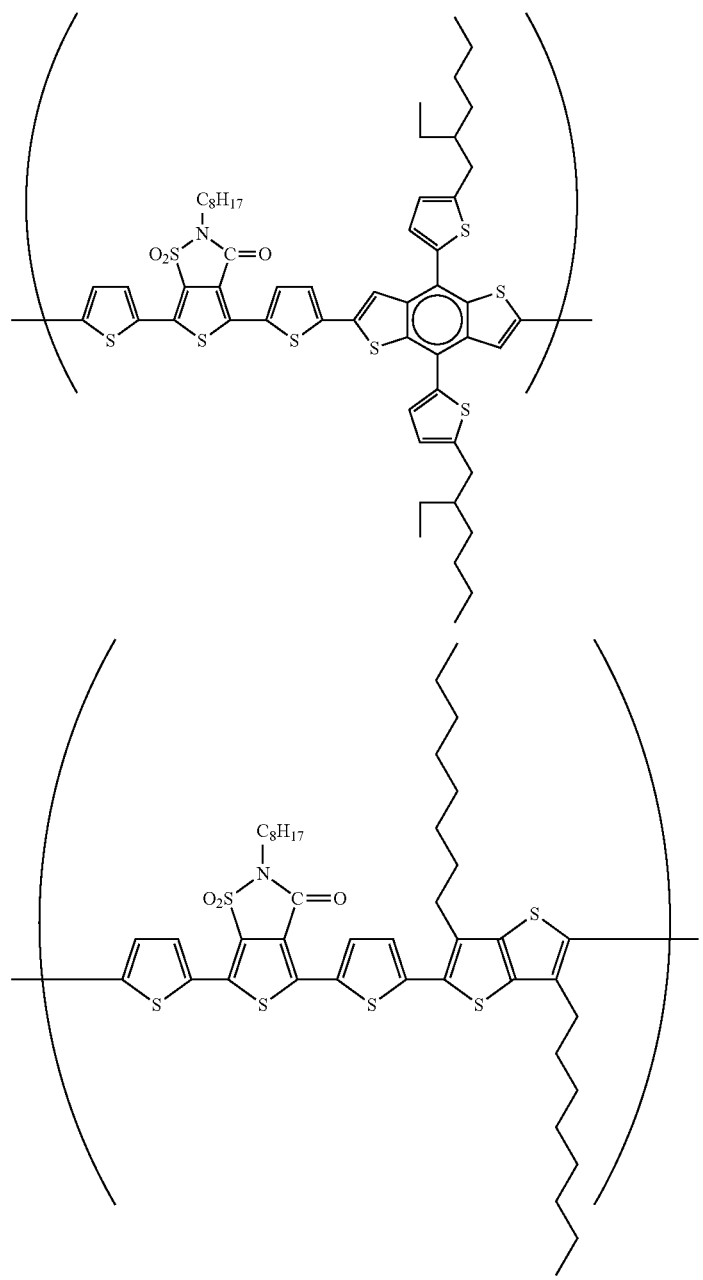

-continued

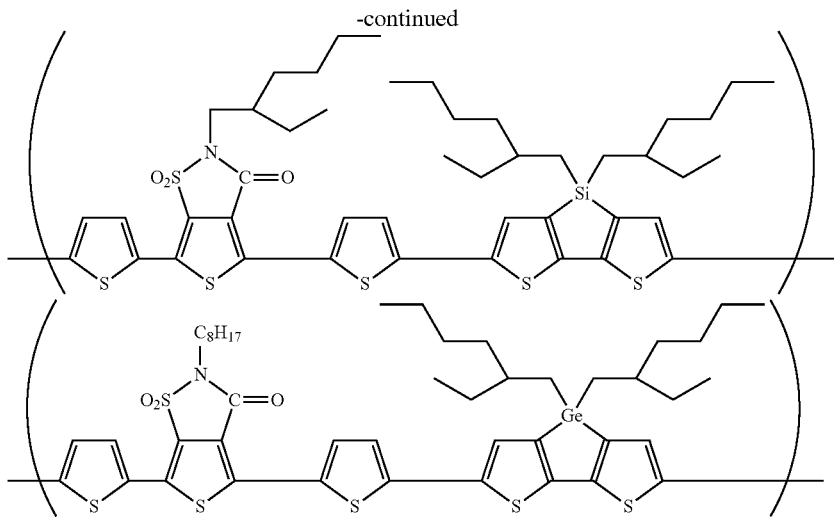

(Fifth Polymer)

A fifth polymer in the embodiment is an organic high molecular compound which includes a recurring unit expressed by the following formula (6). A weight-average molecular weight of the fifth polymer is within a range of 3000 to 1000000.

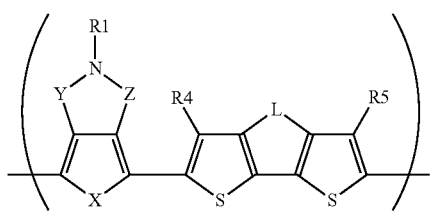

The fifth polymer includes the recurring unit in which a bivalent group with a tricyclic structure derived from thiophene is bonded to the recurring unit expressed by the formula (2), as indicated in the formula (6). According to such a recurring unit, long-wavelength light absorption efficiency of the polymer improves, and stackability when a cell structure is fabricated improves, so that a current easily flows in the cell structure. Owing to these, power generation efficiency of the solar cell can be further increased.

In the recurring unit expressed by the formula (6), the R1 group, X, Y, and Z represent the same substituents or atoms as those in the formula (2) and their concrete examples are also the same. Therefore, in the recurring unit expressed by the formula (6), the same parts as those in the formula (2) are as described in the first polymer. L is one selected from oxygen (O), sulfur (S), a substituted imino group (—NR—), a substituted methylene group (—$CR_2$—), a substituted silylene group (—$SiR_2$—), and a substituted germirene group (—$GeR_2$—). The substituent R in these bivalent groups is the same as the R1 group.

The R4 group and the R5 group are each a monovalent group selected from hydrogen, a substituted or unsubstituted alkyl group, a substituted or unsubstituted aryl group, and a substituted or unsubstituted heteroaryl group. The R4 group and the R5 group may be the same or may be different. In the R4 group and the R5 group, a carbon number of the substituted or unsubstituted alkyl group is preferably within a range of 1 to 30. The substituted or unsubstituted alkyl group may be linear, branched-linear, or cyclic. A carbon number of the substituted or unsubstituted aryl group and heteroaryl group is preferably within a range of 4 to 20. Concrete examples of an alkyl group, an aryl group, and a heteroaryl group are the same as the aforesaid concrete examples of the R1 group.

The weight-average molecular weight of the polymer containing the recurring units expressed by the formula (6) is within the range of 3000 to 1000000, and in this case, good solubility and semiconductor characteristic are obtained. The weight-average molecular weight of the polymer is preferably within a range of 10000 to 600000. The polymer may be constituted by the recurring unit expressed by the formula (6) being bonded in a ring, but the polymer generally contains a terminal group Rt. The terminal group Rt is as described previously. The fifth polymer may be formed only by the recurring unit expressed by the formula (6) or may contain a recurring unit other than that expressed by the formula (6). However, when the number of moles of the recurring unit expressed by the formula (6) is less than 50 mole %, the semiconductor characteristic and so on based on the recurring unit expressed by the formula (6) cannot be sufficiently obtained. Therefore, a ratio of the formula (6) is preferably 50 mole % or more to the total number of moles of all the recurring units in the polymer.

Concrete examples of the polymer including the recurring unit expressed by the formula (6) are given below. However, the fifth polymer of the embodiment is not limited to the following concrete examples.

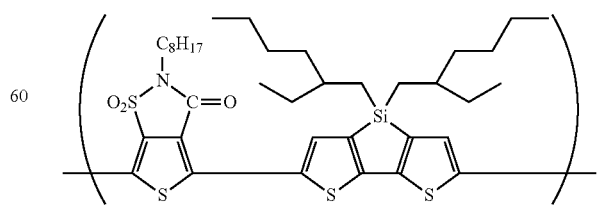

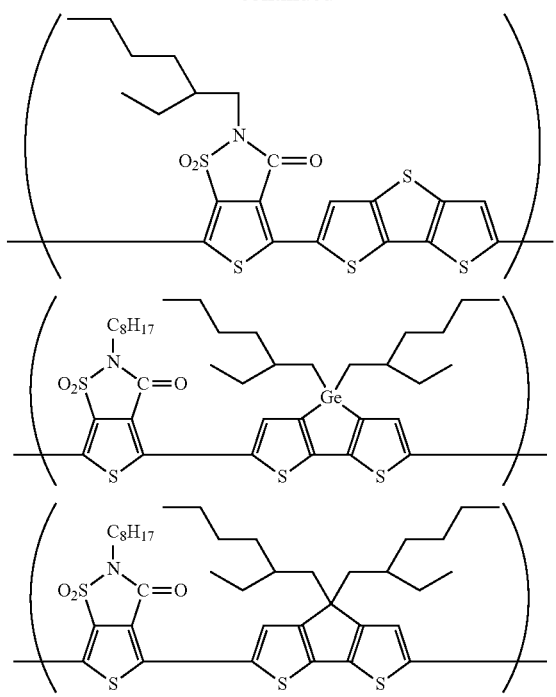

In order to improve durability of the first to fourth polymers of the embodiment, it is preferable that the substituent (R1) in the formula (1) and the formula (2) is, at least one of the substituents (R1, R2, R3) in the formula (3) and the formula (4) is, and at least one of the substituents (R1, R4, R5) in the formula (5) is a cross-linking group. The cross-linking group may be introduced as the terminal group (Rt) instead of as the substituents (R1 to R5). The cross-linking group only needs to be a substituent causing a cross-linking reaction by light, heat, a radical initiator, or the like. Examples of a cross-linking group whose bond is decomposed by light to cause the cross linkage are a substituent containing an alkyl group or an alkoxy group substituting bromine or iodine and a substituent containing an azo group or a diazo group.

The cross-linking group may be a substituent containing a double bond or a triple bond of carbon-carbon and causing photodimerization by light or a substituent causing an addition reaction by heat. Examples of such a substituent are an anthranyl group, a cinnamoyl group, a substituent including a coumarin structure, a phenylmaleimide group, a furfuryl acrylate group, an acetylene group, benzocyclobutene, a cyclopentadienyl group, benzocyclobutene, and a substituent having a sultine structure. Further, as the substituent reacting as the radical initiator, the cross-linking group may be a substituent containing a multiple bond of carbon-carbon, such as an acrylic group or a methacrylic group. Concrete examples of the polymer having the cross-linking group are given below. However, the polymer is not limited to the following concrete examples.

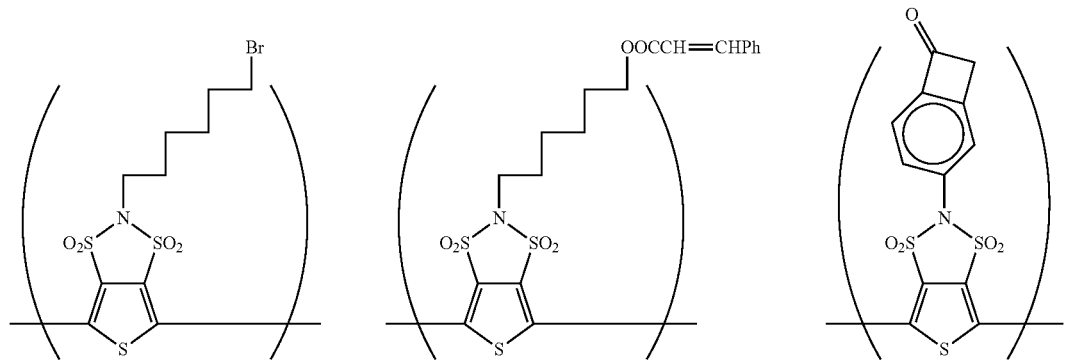

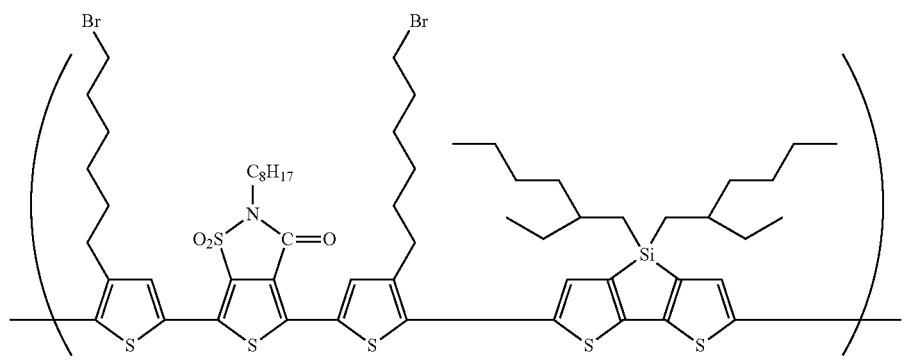

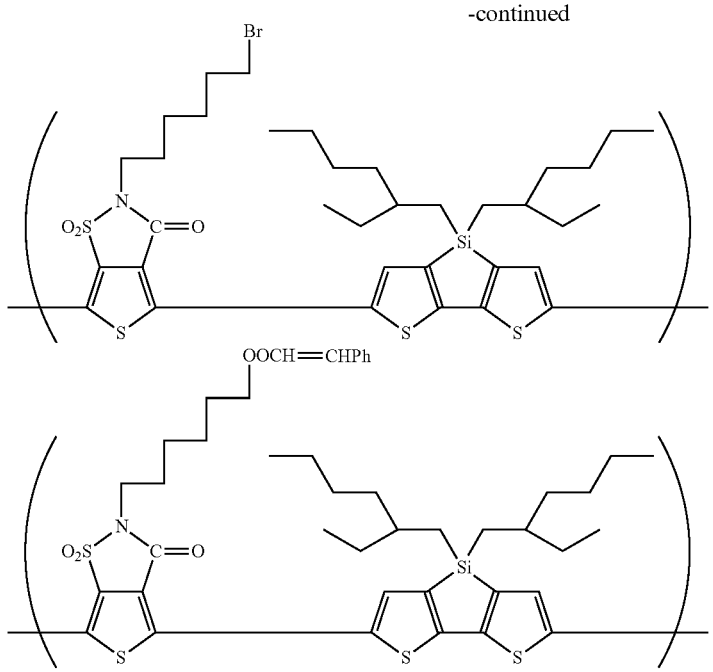

(Method of Synthesizing Organic High Molecular Compound)

A method of synthesizing the organic high molecular compound of the embodiment is not particularly limited. It is possible to synthesize the polymer of the embodiment by, for example, synthesizing monomers having functional groups suitable for a used polymerization reaction, thereafter dissolving the monomers in an organic solvent when necessary, and polymerizing the monomers by using a generally known aryl coupling reaction using an alkali, a catalyst, a ligand, and the like. Examples of the polymerization method by the aryl coupling reaction are polymerization methods using a Stille coupling reaction or a Suzuki coupling reaction.

The polymerization by the Stille coupling is a method in which a palladium complex is used as a catalyst, a ligand is added as required, and a monomer having a trialkyltin residue and a monomer having a halogen atom such as a bromine atom, an iodine atom, or a chlorine atom are made to react with each other. Examples of the palladium complex are palladium[tetrakis(triphenylphosphine)], [tris(dibenzylideneacetone)]dipalladium, palladiumacetate, and bis(triphenylphosphine)palladiumdichloride. The polymerization by the Stille coupling reaction is described in detail in, for example, Patent Document 1. As the solvent used in the Stille coupling reaction, any of organic solvents such as toluene, xylene, N, N-dimethylacetamide, N,N-dimethylformamide, and a mixed solvent in which two kinds or more of these are mixed is used, for instance. However, the solvent is not limited to these solvents. The solvent used in the Stille coupling reaction preferably undergoes deoxidation treatment before the reaction in order to suppress a side reaction.

The polymerization by the Suzuki coupling reaction is a method in which, under the presence of an inorganic base or an organic base, a palladium complex or a nickel complex is used as a catalyst, a ligand is added as required, and a monomer having a boronic acid residue or a boric acid ester residue is made to react with a monomer having a halogen atom such as a bromine atom, an iodine atom, or a chlorine atom or a monomer having a sulfonate group such as a trifluoromethanesulfonate group or a p-toluene sulfonate group.

Examples of the inorganic base are sodium carbonate, potassium carbonate, cesium carbonate, tripotassium phosphate, and potassium fluoride. Examples of the organic base are tetrabutylammonium fluoride, tetrabutylammonium chloride, tetrabutylammonium bromide, and tetraethylammonium hydroxide. Examples of the palladium complex are palladium[tetrakis(triphenylphosphine)], [tris(dibenzylideneacetone)]dipalladium, palladiumacetate, and bis(triphenylphosphine)palladiumdichloride. An example of the nickel complex is bis(cyclooctadiene)nickel. Examples of the ligand are triphenylphosphine, tri(2-methylphenyl)phosphine, tri(2-methoxyphenyl)phosphine, diphenylphosphinopropane, tri(cyclohexyl)phosphine, and tri(tert-butyl)phosphine. The polymerization by the Suzuki coupling reaction is described in detail in, for example, Journal of Polymer Science: Part A: Polymer Chemistry, 2001, vol. 39, p. 1533-1.

In the polymerization by the aryl coupling reaction, a solvent is generally used. The solvent can be selected in consideration of a used polymerization reaction and solubility of the monomers and the polymer. Its concrete examples are organic solvents such as tetrahydrofuran, toluene, 1,4-dioxane, dimethoxyethane, N,N-dimethylacetamide, N,N-dimethylformamide, and a mixed solvent in which two kinds or more of these are mixed, or a solvent having two phases, namely, an organic solvent phase and an aqueous phase. In the Suzuki coupling reaction, it is preferable to use the organic solvent such as tetrahydrofuran, toluene, 1,4-dioxane, dimethoxyethane, N,N-dimethylacetamide, N,N-dimethylformamide, or the mixed solvent in which two kinds or more of these are mixed, or the solvent having two phases, namely, the organic solvent phase and the aqueous phase. The solvent used in the Suzuki coupling reaction preferably undergoes deoxidation treatment before the reaction in order to suppress a side reaction.

From a viewpoint of reactivity, a reaction temperature of the aryl coupling reaction is preferably −100 centigrade degrees or higher, more preferably −20 centigrade degrees or higher, and especially preferably −0 centigrade degrees or higher. From a viewpoint of stability of the monomers and the high molecular compound, the reaction temperature is preferably 200 centigrade degrees or lower, more preferably 150 centigrade degrees or lower, and especially preferably 120 centigrade degrees or lower. In the polymerization by the aryl coupling reaction, a generally known method is applicable for extracting the polymer from a reaction solution after the end of the reaction. For example, by adding the reaction solution to lower alcohol such as methanol, filtrating a precipitated deposit, and drying a filtered substance, it is possible to obtain the polymer of the embodiment. When purity of the obtained polymer is low, it may be refined by recrystallization, continuous extraction by a Soxhlet extractor, column chromatography, or the like.

The polymer of the embodiment can be synthesized by using the Stille coupling reaction. The polymer is synthesized by polymerizing a dihalogen compound expressed by the formula (7) or the formula (8) and bis(trialkyl)tin expressed by the formula (9) or the formula (10), for instance.

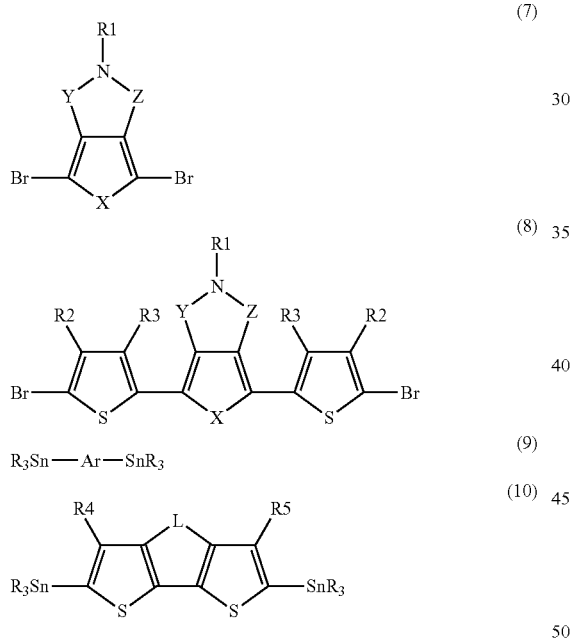

The R1 group, the R2 group, the R3 group, the R4 group, the R5 group, X, Y, Z, L, and A in the aforesaid formula (7) to formula (10) are as previously described. Concrete examples of the compound expressed by the formula (7) and the formula (8) are given below. However, the compound is not limited to the following concrete examples.

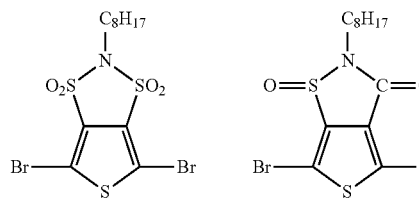

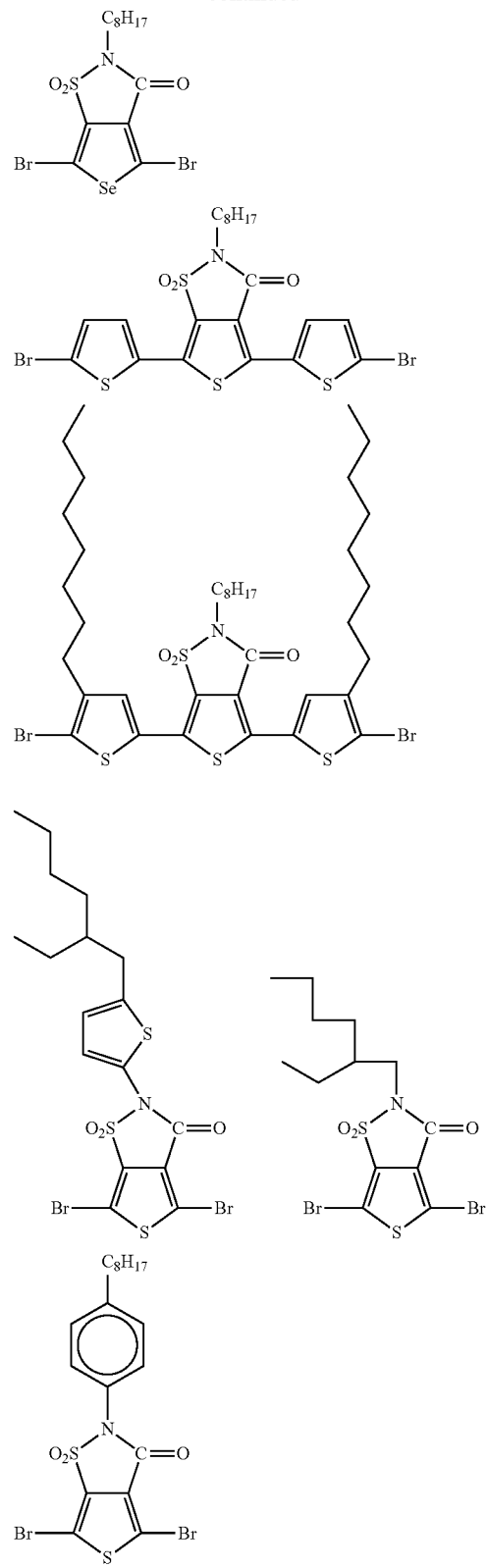

Concrete examples of the compound expressed by the formula (9) and the formula (10) are given below. However, the compound is not limited to the following concrete examples.

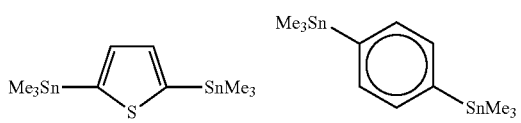
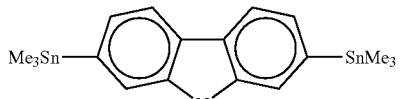
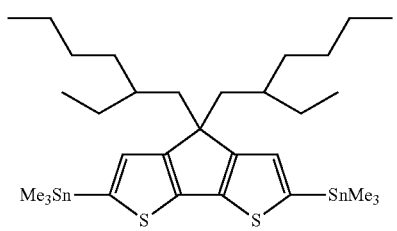
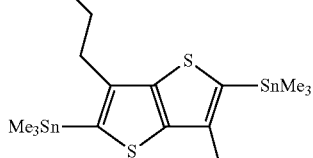
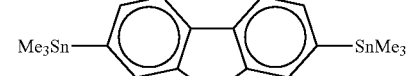
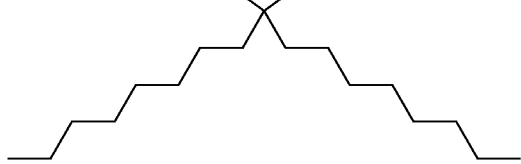
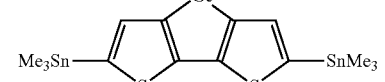
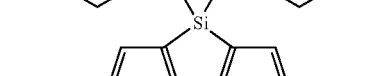
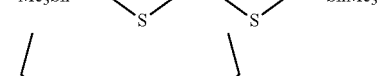
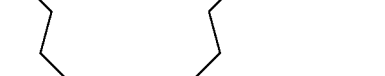
The polymer of the embodiment may have the cross-linking group previously described. In such a case, the polymer is synthesized by using a compound having the cross-linking group. Concrete examples of the compound having the cross-linking group are given below. However, the compound is not limited to the following concrete examples.
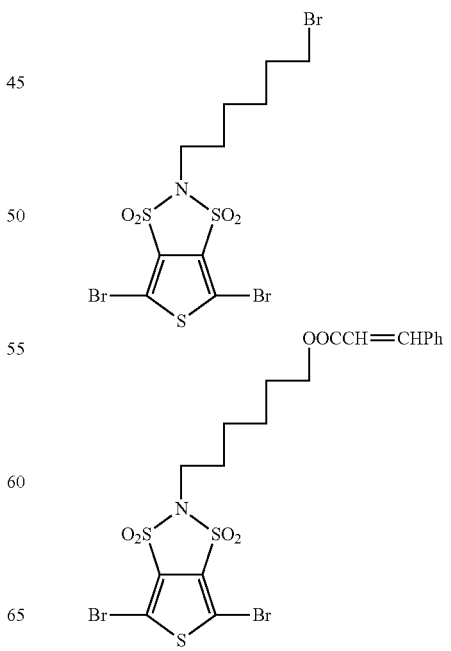

-continued

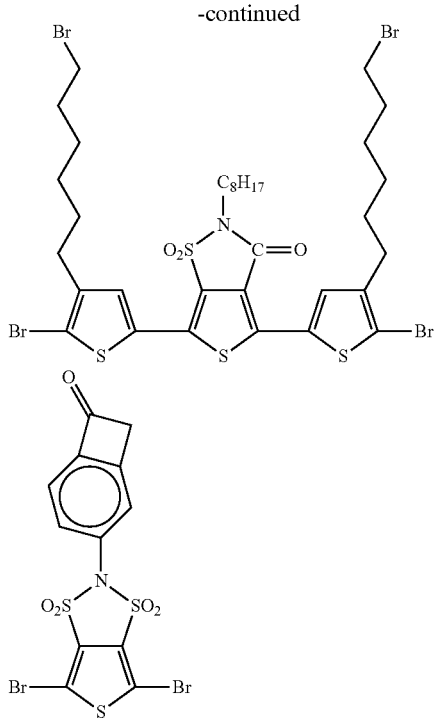

The polymer of the embodiment can be synthesized by using the Suzuki coupling reaction. The polymer is synthesized by polymerizing the compound expressed by the formula (9) or the formula (10) and a compound expressed by a formula (11) or a formula (12), for instance.

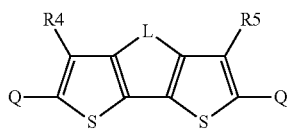

In the formula (11) and the formula (12), Q is a boric acid ester residue and represents a group obtained by removing a hydroxy group from boric acid diester. Concrete examples of the Q group are given below, but the Q group is not limited to these. In the formula, "Me" represents a methyl group and "Et" represents an ethyl group. Hereinafter, Me and Et also represent the same meanings.

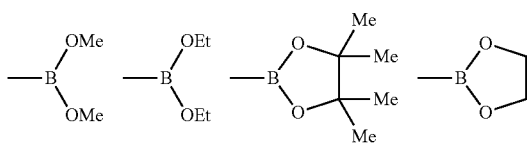

(Solar Cell)

The solar cell of the embodiment includes a pair of electrodes and a photoelectric conversion layer containing an organic material disposed the electrodes. In layers composing the photoelectric conversion layer, the layer containing the organic material is an active layer or a buffer layer.

The active layer containing the organic material is, for example, a layer having a p-type semiconductor material (electron donor) containing the above-described polymer of the embodiment and an n-type semiconductor material (electron acceptor). A photoelectric conversion element including such a photoelectric conversion layer containing an organic material is applicable not only to a solar cell but also to an optical sensor and a light-emitting element.

(Organic Thin-Film Solar Cell)

The solar cell of the embodiment will be described with reference to FIG. 1. A solar cell element 100 illustrated in FIG. 1 includes a first electrode 120, a second electrode 160, and an active layer 140 disposed between these electrodes 120, 160. FIG. 1 illustrates the solar cell element (photoelectric conversion element) used in an ordinary organic thin-film solar cell, but the structure of the solar cell element is not limited to this. The solar cell element 100 of the embodiment may further has a substrate 110 and buffer layers 130, 150. The first electrode 120 is an electrode which captures holes (hereinafter sometimes referred to as an anode). The second electrode 160 is an electrode which captures electrons (hereinafter, sometimes referred to as a cathode). In FIG. 1, the anode 120 is disposed on a substrate 110 side, but the positions of the anode 120 and the cathode 160 may be reversed, and in this case, the positions of the buffer layer 130 and the buffer layer 150 may be reversed. Hereinafter, these parts will be described.

<Active Layer (140)>

The active layer 140 in the solar cell element 100 of the embodiment contains the p-type semiconductor material (electron donor) and the n-type semiconductor material (electron acceptor). The p-type semiconductor material has the polymer of the embodiment, that is, the polymer which contains the recurring unit expressed by the formula (2), the formula (3), the formula (4), the formula (5), or the formula (6) and whose weight-average molecular weight is within the range of 3000 to 1000000 or less. A concrete structure of the polymer as the p-type semiconductor material is as previously described. The n-type semiconductor material (electron acceptor) will be described below. The active layer 140 may contain a plurality of kinds of p-type semiconductor materials and a plurality of kinds of n-type semiconductor materials.

<n-type Semiconductor Material>

Examples of the n-type semiconductor material (electron acceptor) contained in the active layer 140 are a phthalocyanine derivative, fullerene or a fullerene derivative, a boron-containing polymer, poly(benzobis imidazo benzophenanthroline), and so on, but the n-type semiconductor material is not limited to these. Among them, the fullerene derivative is preferable. Concrete examples of the fullerene derivative are 1'1",4',4"-Tetrahydro-di[1,4]methanonaphthaleno[1,2:2',3',56,60:2",3"][5,6]fullerene-C60 (indene-$C_{60}$ bisadducts: IC60BA), [6,6]-Phenyl C61 butyric acid methyl ester (PC60BM), [6,6]-Phenyl C71 butyric acid methyl ester (PC70BM), Dhydronaphtyl-based[0073]fullerene bisadducts (NC60BA), Dihyrdonaphtyl-based[0074]fullerene bissadducts (NC70BA), and so on, but the fullerence derivative is not limited to these.

<Configuration and Structure of Active Layer>

In order to efficiently move electrons from the electron donor (p-type semiconductor) to the electron acceptor (n-type semiconductor), a relative displacement of LUMO energy level between the p-type semiconductor material and the n-type semiconductor material is important. Concretely, the LUMO energy level of the p-type semiconductor material is preferably higher than the LUMO energy level of the n-type semiconductor material by a predetermined energy. In other words, electron affinity of the p-type semiconductor material is preferably larger than electron affinity of the n-type semiconductor material by a predetermined energy.

When the LUMO energy level of the n-type semiconductor material is too high, the movement of the electrons is difficult to occur and accordingly a short-circuit current (Jsc) of the solar cell element 100 tends to be low. On the other hand, an open-circuit voltage (Voc) of the solar cell element 100 is decided by a difference between a HOMO energy level of the p-type semiconductor material and the LUMO energy level of the n-type semiconductor material. Therefore, when the LUMO energy level of the n-type semiconductor material is too low, Voc tends to be low. That is, by simply selecting the n-type semiconductor material whose LUMO energy level is high or low, it is not possible to realize higher conversion efficiency.

In the above-described first to fifth polymers of the embodiment, by selecting the substituents thereof, it is possible to adjust the LUMO energy level. That is, regarding two kinds of monomers constituting a copolymer, by varying substituents, it is possible to obtain compounds having various energy levels. In order to obtain the monomers having various substituents, a generally known technique such as esterification, etherification, or cross-coupling is usable. However, a suitable combination of the p-type semiconductor material and the n-type semiconductor material is not simply decided based only on the LUMO energy level and the HOMO energy level.

In the solar cell element 100, light is absorbed by the active layer 140, charge separation occurs in an interface between the p-type semiconductor and the n-type semiconductor, and generated holes and electrons are taken out from the electrodes 120, 160. A thickness of the active layer 140 is not particularly limited. The thickness of the active layer is preferably 10 nm to 1000 nm, and more preferably 50 nm to 250 nm. Setting the thickness of the active layer to 10 nm or more makes it difficult for a short circuit to occur because uniformity of the layer is maintained. Setting the thickness of the active layer to 1000 nm or less can make an internal resistance small, and further makes it possible to diffuse the charges well because a distance between the electrodes 120, 160 becomes short.

Examples of the concrete structure of the active layer 140 are a thin-film laminated type in which a p-type semiconductor layer and an n-type semiconductor layer are laminated and a bulk hetero junction type in which the p-type semiconductor material and the n-type semiconductor material are mixed. The active layer 140 of the thin-film laminated type may have a layer (i layer) which is disposed between a p-type semiconductor layer and an n-type semiconductor layer and in which the p-type semiconductor material and the n-type semiconductor material are mixed. The solar cell element 100 of the embodiment preferably includes the active layer 140 having the bulk hetero junction structure in which the p-type semiconductor material and the n-type semiconductor material are mixed.

The active layer 140 of the bulk hetero junction type contains the p-type semiconductor material and the n-type semiconductor material. In the active layer 140, a p-type semiconductor phase and an n-type semiconductor phase are separated from each other. When the active layer 140 absorbs light, positive charges (holes) and negative charges (electrons) are separated in an interface between these phases, and are transported to the electrodes 120, 160 through the respective semiconductors. In the active layer 140 of the bulk hetero junction type, the phase separation structure of the p-type semiconductor phase and the n-type semiconductor phase has an influence on a light absorption process, an exciton diffusion process, an exciton dissociation process, a carrier transportation process (charge generation process), a carrier transportation process, and so on. Therefore, in order to increase photoelectric conversion efficiency of the solar cell element 100, it is preferable to make the phase separation structure of the p-type semiconductor phase and the n-type semiconductor phase in the active layer 140 appropriate.

<Formation Method of Active Layer>

A formation method of the active layer 140 is not particularly limited, but a wet coating method such as a spin coating method, an ink-jet method, a doctor blade method, or a drop casting method is preferably employed. In this case, by selecting a solvent in which the p-type semiconductor material (the polymer containing the recurring unit expressed by any of the formula (2) to the formula (6)) and the n-type semiconductor material are soluble, a coating liquid containing the p-type semiconductor material made of the polymer and the n-type semiconductor material is fabricated. Applying this coating liquid makes it possible to form the active layer 140 of the bulk hetero junction type.

A kind of the solvent is not particularly limited, provided that the semiconductor materials are uniformly soluble in it. The solvent can be selected from, for example, aliphatic hydrocarbons such as hexane, heptane, octane, isooctane, nonane, and decane, aromatic hydrocarbons such as toluene, xylene, chlorobenzene, and octodichlorobenzene, lower alcohols such as methanol, ethanol, and propanol, ketones such as acetone, methyl ethyl ketone, cyclopentanone, and cyclohexanone, esters such as ethyl acetate, butyl acetate, and methyl lactate, halogen hydrocarbons such as chloroform, methylene chloride, dichloroethane, trichloroethane, and trichloroethylene, ethers such as ethyl ether, tetrahydrofuran, and dioxane, amides such as dimethylformamide and dimethylacetamide, and so on.

<Additive to Active Layer Coating Liquid>

When the active layer 140 of the bulk hetero junction type is formed by the coating method, adding a compound with a low molecular weight to the coating liquid sometimes improves photoelectric conversion efficiency. A plurality of factors are thought as a mechanism of how the additive optimizes the phase separation structure to improve photoelectric conversion efficiency. One factor thereof may be that, due to the presence of the additive, the aggregation of the p-type semiconductor materials or the n-type semiconductor materials is suppressed. That is, in the absence of the additive, the solvent of the active layer coating liquid (ink) generally volatilizes immediately after the coating. The p-type semiconductor material and the n-type semiconductor material that remain as residual components at this time are thought to form large aggregates respectively. In such a case, a junction area (area of the interface) between the p-type semiconductor material and the n-type semiconductor material becomes small, so that generation efficiency of the charges lowers.

When the ink in which the additive is mixed is applied, the additive remains for a certain time even after the solvent volatilizes. That is, since the additive is present around the p-type semiconductor material or the n-type semiconductor material or both of these, the aggregation of the p-type semiconductor material and/or the n-type semiconductor material is prevented. It is thought that, after the ink is applied, the additive evaporates at a slow speed under a normal temperature and a normal pressure. It is thought that, as the additive evaporates, the p-type semiconductor material and the n-type semiconductor material aggregate, but since the remaining additive suppresses the aggregation, the aggregates formed by the p-type semiconductor material and the n-type semiconductor material become smaller. As a result, the phase separation structure whose junction area with the p-type semiconductor material and the n-type semiconductor material is large and whose charge generation efficiency is high is formed in the active layer 140.

As described above, the additive preferably remains in the active layer 140 for a certain time even after the main solvent of the ink volatilizes. From this viewpoint, a boiling point of the additive is preferably higher than that of the main solvent of the ink. Since the boiling points of chlorobenzene and orthodichlorobenzene often used as the main solvent of the ink are 131 centigrade degrees and 181 centigrade degrees respectively, the boiling point of the additive at the normal pressure (1000 hPa) is preferably higher than these. From the same viewpoint, a vapor pressure of the additive at the normal temperature (25 centigrade degrees) is preferably lower than a vapor pressure of the main solvent of the ink. When the boiling point of the additive is too high, it is thought that the additive does not completely get out of the active layer 140 even after the fabrication of the element, and an amount of the additive staying in the active layer 140 increases. In such a case, it is thought that, due to an increase of impurities, decrease of mobility, that is, decrease of photoelectric conversion efficiency is caused. Therefore, it can be said to be also preferable that the boiling point of the additive is not too high.

The boiling point of the additive under the normal pressure is preferably higher than the boiling point of the main solvent within a range of not lower than 10 centigrade degrees nor higher than 200 centigrade degrees, and more preferably higher than the boiling point of the main solvent within a range of not lower than 50 centigrade degrees nor higher than 100 centigrade degrees. When the boiling point of the additive is too low, the aggregation of the n-type semiconductor material is likely to occur at the time of the drying of the ink, and morphology of the active layer becomes large, so that its surface is liable to have irregularities. The additive is preferably a liquid at the normal temperature (25 centigrade degrees) because this facilitates the fabrication of the ink. When the additive is a solid at the normal temperature, it is thought that dissolving the additive in the main solvent is difficult at the time of the fabrication of the ink or, even if it can be dissolved, a long stirring time is required. In order to optimize the phase separation structure of the active layer 140, not only the boiling point of the additive but also affinity of the additive with the p-type semiconductor material and the n-type semiconductor material is important. Specifically, since the additive interacts with the p-type semiconductor material and the n-type semiconductor material, crystallinities and the like of the p-type semiconductor material and the n-type semiconductor material are liable to change, for instance, depending on the structure of the additive.

Concrete examples of the additive are aromatic compounds such as alkane having a substituent and naphthalene having a substituent. Examples of the substituents are an aldehyde group, an oxo group, a hydroxy group, an alkoxy group, a thiol group, a thioalkyl group, a carboxyl group, an ester group, an amine group, an amide group, a fluoro group, a chloro group, a bromo group, an iodine group, a nitrile group, an epoxy group, an aryl group, and so on. The number of the substituents may be one or may be plural. As the substituent that the alkane has, the thiol group or the iodine group is preferable. As the substituent that the aromatic compound such as the naphthalene has, the bromo group or the chloro group is preferable. Since the boiling point of the additive is preferably high as described above, a carbon number of the alkane is preferably 6 or more, and more preferably 8 or more. Since the additive is preferably a liquid at the normal temperature as described above, the carbon number of the alkane is preferably 14 or less, and more preferably 12 or less.

An amount of the additive contained in the ink (active layer coating liquid) is preferably not less 0.1 weight % nor more than 10 weight % to the total amount of the ink. The amount is more preferably not less than 0.5 weight % nor more than 3 weight % to the total amount of the ink. By setting the amount of the additive within such a range, it is possible to obtain the preferable phase separation structure while reducing the additive remaining in the active layer 140.

<Electrodes (120, 160)>

The electrodes 120, 160 in the solar cell element 100 of the embodiment have a function of capturing holes or electrons which are generated as a result of the absorption of light by the active layer 140. Therefore, the first electrode 120 is preferably suitable for capturing the holes, and the second electrode 160 is preferably suitable for capturing the electrons. At least one of the pair of electrodes 120, 160 preferably has a light transmitting property, and the both may have the light transmitting property. To have the light transmitting property means that 40% of sunlight or more is transmitted. The electrode having the light transmitting property more preferably transmits 70% of the sunlight or more, and consequently, it becomes easy for the light to be transmitted through a transparent electrode to reach the active layer 140. A light transmittance can be measured by an ordinary spectrophotometer, and indicates an average transmittance for a visible light (400 nm to 800 nm), for instance.

<Electrode (Anode 120) Suitable for Capturing Holes>

The electrode (anode) 120 suitable for capturing the holes is generally an electrode made of a conductive material exhibiting a higher work function value than that of the cathode 160. According to such an anode 120, it is possible to smoothly extract the holes generated in the active layer 140. Examples of a formation material of the anode 120 are conductive metal oxides such as nickel oxide, tin oxide, indium oxide, indium tin oxide (ITO), fluorine doped tin oxide (FTO), indium-zirconium oxide (IZO), titanium oxide, zinc oxide, metals such as gold, platinum, silver, chromium, and cobalt, or alloys of these. These substances are preferable because they have a high work function. When the anode 120 is a transparent electrode, it is preferable to use a conductive metal oxide having a light transmitting property such as ITO, zinc oxide, or tin oxide, a composite or a laminate of a metal nanowire of Au, Ag, Cu, or the like or carbon nanotube (CNT) and a conductive metal oxide, a composite or a laminate of a metal nanowire of Au, Ag, Cu, or the like or a carbon nanotube (CNT) and a conductive polymer, or the like, and using ITO is especially preferable.

The aforesaid substances are preferable because they can be stacked with a conductive high molecular material represented by PEDOT/PSS in which a polythiophene derivative is doped with polystyrenesulfonic acid. For example, between the anode layer 120 and the active layer 140, a buffer layer 130 made of the conductive high molecular material can be provided. When the conductive high molecular material is stacked, since a work function of the conductive high molecular material is high, it is possible to use a metal suitable for the anode 120, such as aluminum or magnesium, instead of the aforesaid material having the high work function. The conductive high molecular material itself can be used as a material of the anode 120. Examples of the conductive high molecular material are the aforesaid PEDOT/PSS, a material in which polypyrrole, polyaniline, or the like is doped with iodine or the like.

A film thickness of the anode 120 is not particularly limited, but is preferably not less than 10 nm nor more than 1 micrometer, and more preferably not less than 50 nm nor more than 300 nm. When the film thickness of the anode 120 is too small, sheet resistance becomes high, and when the film thickness is too large, a light transmittance lowers. When the anode 120 is the transparent electrode, the film thickness is preferably selected so that a high light transmittance and a low sheet resistance can both be obtained. The sheet resistance of the anode 120 is not particularly limited, but is generally 1 ohm/square or more, preferably 500 ohm/square or less, and more preferably 200 ohm/square or less. The sheet resistance is preferably small in view of taking out a large current.

Examples of a formation method of the anode 120 are a vacuum film-forming method such as vapor deposition and sputtering, a method of forming a film by applying an ink containing nanoparticles and a precursor, and the like. The precursor is a compound that is converted to a material suitable for the anode 120 by a conversion process after the coating.

<Electrode (Cathode) 160 Suitable for Capturing Electrons>

The electrode (cathode) suitable for capturing the electrons is generally an electrode made of a conductive material exhibiting a higher work function value than that of the anode. Such a cathode 160 can smoothly extract the electrons generated in the active layer 140. Examples of a formation material of the cathode 160 are metals such as platinum, gold, silver, copper, iron, tin, zinc, aluminum, indium, chromium, lithium, sodium, potassium, cesium, calcium, and magnesium, an alloy containing at least one of these metals, inorganic salts such as lithium fluoride and cesium fluoride, and metal oxides such as nickel oxide, aluminum oxide, lithium oxide, and cesium oxide. These materials are suitable for the material of the cathode 160 since they have a low work function.

As for the cathode 160, similarly to the anode 120, a buffer layer 150 can be provided between the cathode 160 and the active layer 140. For example, when one which is an n-type semiconductor such as titania and has conductivity is used as the buffer layer 130, a material having a high work function can be used as the material of the cathode 160. From a viewpoint of electrode protection, metals such as platinum, gold, silver, copper, iron, tin, aluminum, potassium, and indium or alloys of these are preferable as the formation material of the cathode 160.

A film thickness of the cathode 160 is not particularly limited, but is preferably not less than 10 nm nor more than 10 micrometers, and more preferably not less than 50 nm nor more than 500 nm. When the film thickness of the cathode 160 is too small, sheet resistance becomes high, and when the film thickness is too large, a light transmitting property lowers. When the cathode 160 is a transparent electrode, the film thickness is preferably selected so that a high light transmitting property and a low sheet resistance can both be obtained. The sheet resistance of the cathode 160 is not particularly limited, but is preferably 500 ohm/square or less, and more preferably 200 ohm/square or less. Its lower limit value is not limited, but is generally 1 ohm/square or more. The sheet resistance is preferably small from a viewpoint of taking out a larger current.

Examples of a formation method of the cathode 160 are a vacuum film-forming method such as vapor deposition and sputtering, a method of forming a film by applying an ink containing nanoparticles and a precursor, and the like.

<Buffer Layers (130, 150)>

The solar cell element 100 of the embodiment may further has one buffer layer or more in addition to the pair of electrodes 120, 160 and the active layer 140 disposed therebetween. The buffer layers can be classified into the hole extraction layer 130 and the electron extraction layer 150. Generally, the hole extraction layer 130 is disposed between the active layer 140 and the anode 120, and the electron extraction layer 150 is disposed between the active layer 140 and the cathode 160.

<Hole Extraction Layer (130)>

A material of the hole extraction layer 130 is not particularly limited, provided that it is a material capable of improving extraction efficiency of the holes from the active layer 140 to the anode 120. Its concrete examples are conductive polymers in which polythiophene, polypyrrole, polyacethylene, triphenylenediaminepolypyrrol, polyaniline, or the like is doped with a doping material which is at least one of sulfonic acid and iodine. Among them, the conductive polymer doped with sulfonic acid is preferable, and PEDOT:PSS in which a polythiophene derivative is doped with polystyrenesulfonic acid is more preferable. A metal oxide semiconductor such as tungsten oxide or molybdenum oxide may be used. A thin film of metal such as gold, indium, silver, or palladium can also be used as the hole extraction layer 130. The metal thin film may be solely used as the hole extraction layer 130. The combination of the metal thin film and the aforesaid conductive polymer can be also used as the hole extraction layer 130.

A film thickness of the hole extraction layer 130 is not particularly limited, but is generally not less than 1 nm nor more than 200 nm. The film thickness of the hole extraction layer 130 is preferably 5 nm or more, and is preferably 100 nm or less. When the film thickness of the hole extraction layer 130 is too small, uniformity becomes insufficient, which tends to cause a short circuit. When the film thickness of the hole extraction layer 130 is too large, a resistance value increases, which tends to make it difficult to extract the holes.

<Electron Extraction Layer (150)>

A material of the electron extraction layer 150 is not particularly limited, provided that it is a material capable of improving extraction efficiency of the electrons from the active layer 140 to the cathode 160. A formation material of the electron extraction layer 150 is roughly classified into an inorganic compound and an organic compound. The electron extraction layer 150 may be formed by using only either of these materials or may be formed by using the both materials. A laminate of an inorganic compound layer and an organic compound layer may be used as the electron extraction layer 150.

As the inorganic compound material used for the electron extraction layer 150, salt of alkali metal such as lithium, sodium, potassium, or cesium, or an n-type oxide semiconductor compound such as titanium oxide ($TiO_x$) or zinc oxide (ZnO) is preferable. As the salt of the alkali metal, fluoride salt such as lithium fluoride, sodium fluoride, potassium fluoride, or cesium fluoride is preferable. By using such a material, it is possible to decrease a work function of the cathode 160 to increase a voltage applied to the inside of the solar cell element 100 when it is used in combination with the cathode 160 made of aluminum or the like.

When the alkali metal salt is used as the formation material of the electron extraction layer 150, it is possible to form the electron extraction layer 150 by using a vacuum film-forming method such as vacuum vapor deposition or sputtering. Above all, the electron extraction layer 150 is desirably formed by vacuum vapor deposition by resistance heating. Using the vacuum vapor deposition makes it possible to reduce damage to other layers such as the active layer 140. Its film thickness in this case is preferably not less than 0.1 nm nor more than 50 nm, and more preferably 20 nm or less. When the electron extraction layer 150 is too thin, an effect of improving electron extraction efficiency is not sufficient. When the electron extraction layer 150 is too thick, the electron extraction layer 150 works as a series resistance component, which is liable to impair a characteristic of the element.

When titanium oxide is used as the formation material of the electrone extraction layer 150, it is possible to form the electron extraction layer 150 by using a vacuum film-forming method such as a sputtering method. The electron extraction layer 150 made of titanium oxide is more preferably formed by using a coating method. For example, it is possible to form the electron extraction layer 150 made of titanium oxide by a sol-gel method described in Adv. Mater. 18, 572 (2006). The film thickness in this case is generally not less than 0.1 nm nor more than 100 nm, and preferably not less than 5 nm nor more than 50 nm. When the electron extraction layer 150 is too thin, the effect of improving electron extraction efficiency is not sufficient. When the electron extraction layer 150 is too thick, the electron extraction layer 150 works as a series resistance component, which is liable to impair the characteristic of the element.

When zinc oxide is used as the formation material of the electron extraction layer 150 as well, it is possible to form it by using a vacuum film-forming method such as a sputtering method. The electron extraction layer 150 is preferably formed by using a coating method. For example, according to a sol-gel method described in Sol-Gel Science, C. J. Brinker, G. W. Scherer, Academic Press (1990), it is possible to form the electron extraction layer 150 made of zinc oxide. The film thickness in this case is generally not less than 0.1 nm nor more than 400 nm, and preferably not less than 1 nm nor more than 50 nm. When the electron extraction layer 150 is too thin, the effect of improving electron extraction efficiency is not sufficient. When the electron extraction layer 150 is too thick, the electron extraction layer 150 works as a series resistance component, which is liable to impair the characteristic of the element.

Examples of the organic compound material used as the electron extraction layer 150 are bathocuproine (BCP), bathophenanthroline (Bphen), (8-hydroxyquinolinato)aluminum (Alq3), a boron compound, an oxadiazole compound, a benzimidazole compound, a naphthalenetetracarboxylic acid anhydride (NTCDA), a perylenetetracarboxylic acid anhydride (PTCDA), a phosphineoxide compound, a phosphinesulfide compound, and a conductive polymer, but the organic compound material is not limited to these. The above-described organic compound material may be doped with a metal such as an alkali metal or an alkaline-earth metal.

When the organic compound is used as the formation material of the electron extraction layer 150, the film thickness of the electron extraction layer 150 is generally not less than 0.5 nm nor more than 500 nm, and is preferably not less than 1 nm nor more than 100 nm. When the electron extraction layer 150 is too thin, the effect of improving electron extraction efficiency is not sufficient. When the electron extraction layer 150 is too thick, the electron extraction layer 150 works as a series resistance component, which is liable to impair the characteristic of the element. When a plurality of materials are used to form the electron extraction layer 150, the total thickness of the electron extraction layer 150 is generally not less than 0.1 nm nor more than 100 nm, and is preferably 60 nm or less.

<Formation Method of Buffer Layers>

A formation method of the buffer layers 130, 150 is not particularly limited. Film-forming methods of several materials are as described above. Generally, when a material having sublimability is used, a vacuum film-forming method such as a vacuum vapor deposition method is usable. When a material soluble in a solvent is used, a wet coating method such as spin coating or ink-jetting is usable.

<Substrate (110)>

The solar cell element 100 generally has the substrate 110 serving as a support. Specifically, on the substrate 110, the electrodes 120, 160, the active layer 140, and the buffer layers 130, 150 are formed. A material of the substrate 110 is not particularly limited. Examples of the substrate material are inorganic materials such as quartz, glass, sapphire, and titania, polyolefins such as polyethylene terephthalate, polyethylene naphthalate, polyethersulfone, polyimide, nylon, polystyrene, polyvinyl alcohol, an ethylene-vinylalcohol copolymer, fluorocarbon resin, vinyl chloride, and polyethylene, organic materials such as cellulose, polyvinylidene chloride, aramid, polyphenylene sulfide, polyurethane, polycarbonate, polyarylate, polynorbornene, and epoxy resin, paper materials such as paper and synthetic paper, composite materials in which a layer imparting an insulating property to metal such as stainless steel, titanium, or aluminum is applied or stacked, and so on. Examples of the glass are soda glass, blue plate glass, and no-alkali glass. Regarding a material of the glass, since an amount of eluted ions is preferably small, no-alkali glass is preferable. When thin glass with 0.3 mm or less is used, a laminate with the aforesaid polymer film may be used as the substrate so that the glass does not easily crack.

A shape of the substrate 110 is not limited, and a shape of a board, a film, a sheet, or the like is usable. A thickness of the substrate 110 is not particularly limited, either. The thickness of the substrate 110 is generally not less than 5 micrometers nor more than 20 nm, and preferably not less than 20 micrometers nor more than 10 mm. When the substrate 110 is too thin, strength of the solar cell element 100 is liable to be insufficient. When the substrate 110 is too thick, it is liable to cost high and be too heavy. When the substrate 110 is glass, if it is too thin, its mechanical strength deteriorates and the substrate 110 is likely to crack, and therefore its thickness is preferably 0.01 mm or more, and more preferably 0.1 mm or more. When the substrate 110 is too thick, it becomes heavy, and therefore the thickness of the substrate 110 is preferably 10 mm or less, and more preferably 3 mm or less.

<Manufacturing Method of Solar Cell Element 100>

The solar cell element 100 of the embodiment is fabricated by sequentially forming the electrode 120, the active layer 140, and the electrode 160 on the substrate 110 by the above-described methods. When the buffers 130, 150 are provided, the electrode 120, the buffer layer 130, the active layer 140, the buffer layer 150, and the electrode 160 are sequentially formed on the substrate 110. Further, heating treatment (annealing treatment) is preferably applied to a laminate which is obtained by sequentially forming the layers on the substrate 110. Appling the annealing treatment sometimes improves heat stability and durability of the solar cell element 100. The annealing treatment sometimes improves adhesion between the layers, which is thought to be one reason.

A heating temperature is generally 200 centigrade degrees or lower, preferably 180 centigrade degrees or lower, and more preferably 150 centigrade degrees or lower. The heating temperature is generally 50 centigrade degrees or higher, and preferably 80 centigrade degrees or higher. When the temperature is too low, the adhesion improving effect may not be sufficiently obtained. When the temperature is too high, the compound contained in the active layer 140 may thermally decompose, for instance. To the annealing treatment, heating at a plurality of temperatures may be applied. The heating time is generally not less than one minute nor more than three hours, and preferably not less than three minutes nor more than one hour. The annealing treatment is preferably finished when an open-circuit voltage, a short-circuit current, an a fill factor which are parameters of performance of the solar cell reach predetermined values. The annealing treatment is preferably performed under the normal pressure, and is also preferably performed in an inert gas atmosphere.

The solar cell of the embodiment can be fabricated by using an arbitrary method. For example, it is possible to fabricate the solar cell while a surface of an organic thin-film solar cell (solar cell element 100) is covered by an appropriate protective material in order to improve weather resistance, according to a generally know technique. Examples of the protective material are a weather-resistant protective film, an ultraviolet cut film, a gas barrier film, a getter material film, a sealant, and so on. Besides, a generally known structure can be added.

(Organic/Inorganic Hybrid Solar Cell)

Next, there will be explained another example of the solar cell of the embodiment. Here, an example where the solar cell of the embodiment is applied to an organic/inorganic hybrid solar cell will be described. The organic/inorganic hybrid solar cell has a laminated structure of a substrate/a cathode electrode/an electron extraction layer/an active layer/a hole extraction layer/an anode electrode (an inverted structure), for example. The position of the cathode electrode and the position of the anode electrode may be opposite to each other. The aforesaid organic solar cell has a laminated structure of a substrate/an anode electrode/a hole extraction layer/an active layer/an electron extraction layer/a cathode electrode (a sequential structure). The inverted structure can be applied to the organic solar cell.

For the active layer of the organic/inorganic hybrid solar cell, an organic/inorganic mixed perovskite compound is used. Further, for the hole extraction layer of the organic/inorganic hybrid solar cell, a p-type semiconductor material is used. The p-type semiconductor material forming the hole extraction layer includes the above-described polymer of the embodiment, that is, the polymer which contains the recurring unit expressed by the formula (2), the formula (3), the formula (4), the formula (5), or the formula (6) and whose weight-average molecular weight is within the range of 3000 to 1000000 or less. The concrete constitution of the polymer as the p-type semiconductor material is described previously. The hole extraction layer may contain a plurality of kinds of p-type semiconductor materials.

In the organic/inorganic hybrid solar cell, radiated light is absorbed into the active layer containing the organic/inorganic mixed perovskite compound, and thereby charge separation occurs in the active layer. Electrons generated by the charge separation are extracted from the cathode electrode and holes are extracted from the anode electrode. In the organic/inorganic hybrid solar cell, the same buffer layers (electron extraction layer and hole extraction layer) as those of the organic thin-film solar cell can be used. The organic/inorganic hybrid solar cell is fabricated by the same method as that of the above-described organic thin-film solar cell except that laminating order is reverse.

The organic/inorganic mixed perovskite compound used for the active layer of the organic/inorganic hybrid solar cell has a composition represented by the following expression (13), for example.

$$CH_3NH_4ML_3 \quad (13)$$

In the expression (13), M indicates at least one atom selected from the group consisting of lead (Pb) and tin (Sn), and L indicates at least one atom selected from the group consisting of iodine (I), bromine (Br), and chlorine (Cl).

As a fabrication method of the active layer, there can be cited a method of vacuum-depositing the above-described perovskite compound or a precursor thereof, and a method in which a solution obtained by dissolving the perovskite compound or the precursor thereof in a solvent is applied to be heated and dried. As the precursor of the perovskite compound, for example, a mixture of methylammonium halide and lead halide or stannic halide can be cited. The active layer is formed as a result that the solution obtained by dissolving the perovskite compound or the precursor thereof in a solvent is applied to be heated and dried. Alternatively, the active layer can also be formed as a result that as the precursor, a lead halide or stannic halide solution is applied to be dried, and then a methylammonium halide solution is applied to be heated and dried.

The kind of solvent is not limited in particular as long as the solvent is one capable of dissolving the perovskite compound or the precursor thereof uniformly. The solvent is selected from among, for example, low alcohols such as methanol, ethanol, propanol, ethylene glycol, and methoxyethanol, ketones such as acetone, methyl ethyl ketone, cyclopentanone, and cyclohexanone, esters such as ethyl acetate, butyl acetate, and methyl lactate, ethers such as ethyl ether, tetrahydrofuran, and dioxane, and amides such as dimethylformamide and dimethyl acetamide.

The thickness of the active layer is not limited in particular, but is preferable to be not less than 10 nm nor more than 1000 nm, and further preferable to be not less than 50 nm nor more than 600 nm. When the thickness of the active layer is 10 nm or more, uniformity of the active layer is maintained and a short circuit becomes unlikely to occur. When the thickness of the active layer is 1000 nm or less, internal resistance can be made small, and further as a result that the distance between the electrodes becomes closer, electric charges can be well diffused.

In the organic/inorganic hybrid solar cell of the embodiment, between the active layer and the anode electrode, the hole extraction layer (buffer layer) made of the p-type semiconductor material containing the polymer which includes the recurring unit expressed by the formula (2) to (6) of the embodiment is provided. The hole extraction layer is formed by applying a solution obtained by dissolving the polymer in a solvent, for example. The thickness of the hole extraction layer is not limited in particular, but is normally not less than 1 nm nor more than 100 nm. The thickness of the hole extraction layer is preferable to be not less than 2 nm nor more than 50 nm. If the thickness of the hole extraction layer is too thin, uniformity becomes insufficient and there is a tendency that a short circuit is likely to occur.

If the thickness of the hole extraction layer is too thick, a resistance value increases and there is a tendency that a hole is unlikely to be extracted.

In the organic/inorganic hybrid solar cell of the embodiment, similarly to the above-described organic solar cell, the electron extraction layer (buffer layer) provided between the active layer and the cathode layer may be provided. The forming material and the forming method of the electron extraction layer are as described above. Further, the forming materials of the anode electrode and the cathode electrode are also as described above. The other constitutions of the organic/inorganic hybrid solar cell are also the same as those of the above-described organic thin-film solar cell.

Next, examples and evaluation results thereof will be described.

Example 1

Synthesis of poly(4,8-bis(5-(2-ethylhexyl)thienyl)benzo[1,2-b:4,5-b']dithiophene-2,6-diyl-alt-(N-octyl-2,3-dihydro-3-oxo-thieno[3,4-d]isothiazole-1,1-dione-4,6-diyl)) [P1]

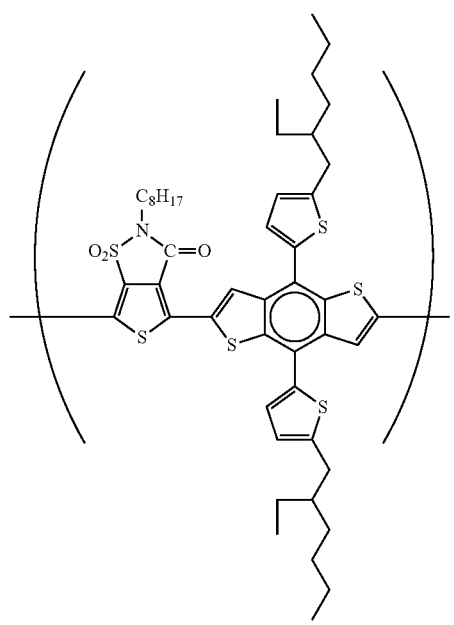

Under nitrogen, 1.091 g (1.21 mmol) 2,6-bis(trimethyltin)-4,8-bis(5-(2-ethylhexyl)thiophene-2-yl)benzo(1,2-b:4,5-b')dithiophene and 0.055 g tetrakis(triphenylphosphine)palladium (catalyst) are weighed in a three-neck flask having a three-way cock, and while argon is supplied to the three-neck flask through the three-way cock, a reflux pipe having an argon conduit is fit to the three-neck flask while the argon is supplied, and subsequently, a dropping funnel is attached while the entrance of the air is prevented in order to prevent deactivation of the catalyst due to the mixture of the air. The argon conduit is connected to a vacuum line and argon and the vacuum can be switched over. The three-way cock is closed to make the inside of the flask vacuum, and argon is introduced again. This operation is repeated three times.

Meanwhile, under nitrogen, 4,6-dibromo-N-octyl-2,3-dihydro-3-oxo-thieno[3,4-d]isothiazole-1,1-dione (0.538 g, 1.21 mmol) is weighed into a flask, a three-way cock is mounted on the flask, and argon is connected to one of the three ways. By using one way of the three-way cock, 24 ml anhydrous toluene deaerated by a syringe is added by opening the three-way cock (argon has been supplied from the one way) attached to this flask and is dissolved, and thereafter the resultant is sucked out by a syringe, and this toluene solution is added by opening the three-way cock (argon has been supplied from the one way) attached to the three-neck flask. Further, 6 ml anhydrous dimethylformamide (DMF) deaerated by a syringe is weighed and is added to the flask similarly to the above, and the three-way cock is closed.

This three-neck flask is heated by an oil bath to cause a reaction for twelve hours at a reflux temperature and is cooled to room temperature. Under nitrogen, 0.109 g trimethylphenyltin is weighed and is dissolved in 4 ml deaerated anhydrous toluene, and the resultant is added to the flask by a syringe similarly to the above, and heating and reflux are performed for two hours. After cooling to room temperature, under nitrogen, 0.097 g bromobenzene is weighed and is dissolved in 4 ml deaerated anhydrous toluene, and the resultant is added to the flask by a syringe similarly to the above, and heating and reflux are performed for two hours. After cooling to room temperature, this reaction liquid is dropped into 500 ml methanol while stirring, and a polymer is settled. This deposit is filtrated by a glass filter and thereafter is dissolved in chloroform, and the catalyst is removed by a celite column. After the solvent is condensed by an evaporator, methanol is added, and after sufficient stirring, the resultant is filtrated by using a glass filter, whereby a solid is obtained. This solid is vacuum-dried at 80 centigrade degrees for four hours, whereby a 1,080 g black brass-colored polymer having a metallic luster is obtained. Refining is performed by ethyl acetate, hexane, toluene, and chlorobenzene in the order mentioned by Soxhlet extraction. Thereafter, a benzene extraction component is used.

The obtained solid is evaluated by using a NMR apparatus (JNM-GSX270 (trade name), manufactured by JEOL Ltd.). The obtained result is "1H-NMR (270 MHz, CDCl3): partial 8.2-6.35 (broad), 3.9-3.5 (broad), 3.2-2.6 (broad), 2.3-0.6 (m)". In partial 6.35-8.2 ppm, a peak of an aromatic proton of a benzodithiophene ring and a thiophene ring of a side chain is observed, and in 3.5-3.9 ppm, a peak corresponding to $CH_2$ bonded to a nitrogen atom and a peak corresponding to $CH_2$ cyclically bonded to the thiophene of the side chain, and in 0.6-2.3 ppm, a peak corresponding to an alkyl group are all observed as broad peaks, and this compound is confirmed as being an intended polymer.

Further, evaluation by gel permeation chromatography is also conducted. When a polystyrene-equivalent weight-average molecular weight is measured by using a GPC apparatus (HPCL: CBM20 (trade name) manufactured by Shimadzu Corporation, column: K-504 manufactured by Shodex, solvent: chloroform), it is 64000 (Mw/Mn=2.5). When a UV-vis absorption spectrum is measured (A2000 (trade name) manufactured by Shimadzu Corporation, a chloroform solution is used), the maximum absorption peak (lambda max) is 619 nm.

2,6-bis(trimethyltin)-4,8-bis(5-(2-ethylhexyl)thiophene-2-yl)benzo(1,2-b:4,5-b')dithiophene used in the polymer synthesis is synthesized by a method [0131] described in Lijin Huo, et. al, Angew. Chem. Int. Ed. 2011, 50, 9697. Further, 2,3-dihydro-3-oxo-thieno[3,4-d]isothiazole-1,1-dione is synthesized by using a method such as Phillip A Rossy described in J. Org. Chem., Vol. 45, 617-620 (1980).

4,6-dibromo-N-octyl-2,3-dihydro-3-oxo-thieno[3,4-d]isothiazole-1,1-dione (0.538 g, 1.21 mmol) being a monomer is synthesized as follows.

(1) Synthesis of N-octyl-2,3-dihydro-3-oxo-thieno[3,4-d]isothiazole-1,1-dione 0.497 g sodium hydride is weighed into a four-neck flask, a thermometer, a nitrogen introducing and reflux pipe, and a dropping funnel are attached, a rotor is put in, and after a nitrogen atmosphere is made by supplying nitrogen, 10 ml anhydrous DMF is added. In the dropping funnel, 1.892 g (10 mmol) 2,3-dihydro-3-oxo-thieno[3,4-d]isothiazole-1,1-dione dissolved in 20 ml anhydrous DMF is put. After the flask is cooled by ice water, this solution is dropped. After the dropping, the temperature is returned to room temperature and a reaction is caused for two hours, and thereafter, 1-bromo-octane (3.100 g) dissolved in 10 ml anhydrous DMF is added. After thirty-minute stirring at room temperature, a reaction is caused at 80 centigrade degrees for six hours. After the temperature is returned to room temperature, water is added, followed by the extraction by chloroform, an organic layer is dried by anhydrous magnesium sulfate, and after the solvent is removed under a reduced pressure, refining by column chromatography (silica gel, developing solvent toluene) is performed, whereby 1.799 g (59.5% yield) N-octyl-2,3-dihydro-3-oxo-thieno[3,4-d]isothiazole-1,1-dione is obtained.

Regarding the obtained compound, NMR evaluation is conducted similarly to the above. The obtained result is "1H-NMR (270 MHz, CDCl3) partial: 0.88 (t, 3H, J=6.6 Hz), 1.08-1.51 (m, 10H), 1.75-1.9 (m, 2H), 3.70 (t, 2H, J=7.6 Hz), 7.93 (d, 1H, J=2.6 Hz), 8.04 (d, 1H, J=2.6 Hz)".

(2) Synthesis of 4,6-dibromo-N-octyl-2,3-dihydro-3-oxo-thieno[3,4-d]isothiazole-1,1-dione A reflux pipe, a dropping funnel, and a thermometer are attached to a four-neck flask, a rotor is put in, and 1.786 g (5.93 mmol) N-octyl-2,3-dihydro-3-oxo-thieno[3,4-d]isothiazole-1,1-dione and 3.170 g (17.8 mmol) N-bromosuccinimide are added. There, 9 ml concentrated sulfuric acid and 30 ml trifluoroacetic acid are added from the dropping funnel. After a reaction is caused at room temperature for 18 hours, a reaction mixture is poured into a beaker with about 400 ml ice water. Extraction by chloroform is performed, an organic layer is dried by anhydrous magnesium, and thereafter the solvent is condensed under a reduced pressure. A residue is refined by column chromatography (silica gel, toluene/hexane), whereby a 1.771 g (67.1% yield) white solid of 4,6-dibromo-N-octyl-2,3-dihydro-3-oxo-thieno[3,4-d]isothiazole-1,1-dione is obtained.

The evaluation result of NMR is "1H-NMR (270 MHz, CDCl3) partial: 0.89 (t, 3H, J=6.4 Hz), 1.12-1.48 (m, 10H), 1.65-1.89 (m, 2H), 3.67 (t, 2H, J=7.4 Hz)".

Example 2

Synthesis of poly(4,8-bis(5-(2-ethylhexyl)thienyl)benzo[1,2-b:4,5-b']dithiophene-2,6-diyl-alt-(N-(2-ethylhexyl)-2,3-dihydro-3-oxo-thieno[3,4-d]isothiazole-1,1-dione-4,6-diyl)) [P2]

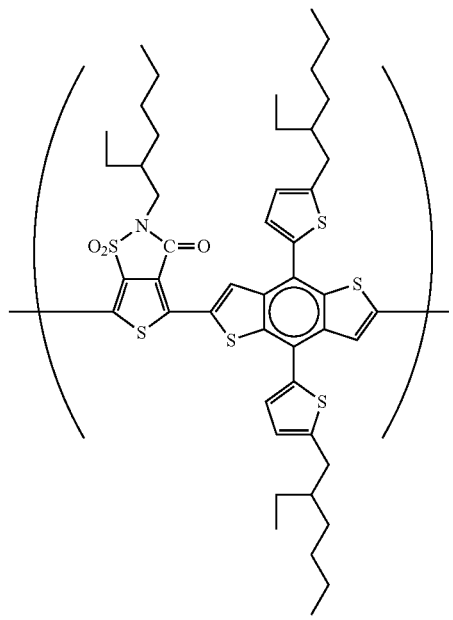

The synthesis is performed under the same condition as that of the example 1 except in that 4,6-dibromo-N-(2-ethylhexyl)-2,3-dihydro-3-oxo-thieno[3,4-d]isothiazole-1,1-dione is used instead of 4,6-dibromo-N-octyl-2,3-dihydro-3-oxo-thieno[3,4-d]isothiazole-1,1-dione of the example 1, whereby a 1.012 g burgundy polymer having a metallic luster is obtained. Refining is performed by ethyl acetate, hexane, toluene, and chlorobenzene in the order mentioned by Soxhlet extraction. Thereafter, a benzene extraction component is used.

Regarding the obtained compound, NMR is evaluated. The evaluation result is "1H-NMR (270 MHz, CDCl3): partial 8.2-6.35 (broad), 3.9-3.45 (broad), 3.2-2.6 (broad), 2.4-0.6 (m)". In partial 6.35-8.2 ppm, a peak of an aromatic proton of a benzodithiophene ring and a thiophene ring of a side chain is observed, and in 3.45-3.9 ppm, a peak corresponding to CH2 bonded to a nitrogen atom and a peak corresponding to CH2 bonded to the thiophene ring of the side chain, and in 0.6-2.3 ppm, a peak corresponding to an alkyl group are all observed as broad peaks, and this compound is confirmed as being an intended polymer. Further, when a weight-average molecular weight and a UV-vis absorption spectrum are measured by the same methods as those previously described, the polystyrene-equivalent weight-average molecular weight is 45000 (Mw/Mn=2.1) and the maximum absorption peak (lambda max) is 610 nm.

4,6-dibromo-N-(2-ethylhexyl)-2,3-dihydro-3-oxo-thieno[3,4-d]isothiazole-1,1-dione being a monomer is synthesized by the same method except in that 1-bromo-2-ethylhexane is used instead of 1-bromooctane used in the synthesis of the example 1.

Example 3

Synthesis of poly(4,8-bis(5-(2-ethylhexyl)thienyl)benzo[1,2-b:4,5-b']dithiophene-2,6-diyl-alt-(N-(4-octyl)phenyl-2,3-dihydro-3-oxo-thieno[3,4-d]isothiazole-1,1-dione-4,6-diyl)) [P3]

[P3]

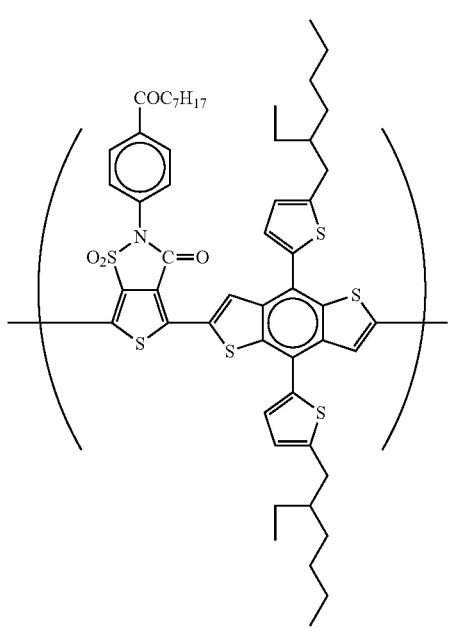

[P4]

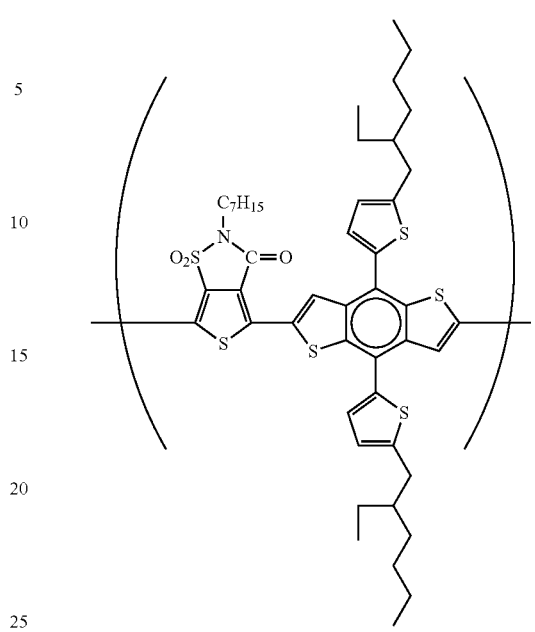

The synthesis is performed under the same condition as that of the example 1 except in that 4,6-dibromo-N-4-octylphenyl-2,3-dihydro-3-oxo-thieno[3,4-d]isothiazole-1,1-dione is used instead of 4,6-dibromo-N-octyl-2,3-dihydro-3-oxo-thieno[3,4-d]isothiazole-1,1-dione of the example 1, whereby a 1.012 g burgundy polymer having a metallic luster is obtained. Refining is performed by ethyl acetate, hexane, toluene, and chlorobenzene in the order mentioned by Soxhlet extraction. Thereafter, a benzene extraction component is used.

Regarding the obtained compound, NMR is evaluated. The evaluation result is "1H-NMR (270 MHz, CDCI3): partial 8.2-6.35 (broad), 3.2-2.6 (broad), 2.4-0.6 (m)". In 6.35-8.2 ppm, a peak of an aromatic proton of a benzodithiophene ring and a thiophene ring of a side chain is observed, and in 3.2-2.6 ppm, a peak corresponding to $CH_2$ bonded to the thiophene ring of the side chain and $CH_2$ bonded to the benzene ring and in 0.6-2.3 ppm, a peak corresponding to an alkyl group are all observed as broad peaks, and this compound is confirmed as being an intended polymer. Further, when a weight-average molecular weight and a UV-vis absorption spectrum are measured by the same methods as those previously described, the polystyrene-equivalent weight-average molecular weight is 71000 (Mw/Mn=3.2) and the maximum absorption peak (lambda max) is 631 nm.

Example 4

Synthesis of poly(4,8-bis(5-(2-ethylhexyl)thienyl)benzo[1,2-b:4,5-b']dithiophene-2,6-diyl-alt-(N-heptyl-2,3-dihydro-3-oxo-thieno[3,4-d]isothiazole-1,1-dione-4,6-diyl)) [P4]

The synthesis is performed under the same condition as that of the example 1 except in that 4,6-dibromo-N-heptyl-2,3-dihydro-3-oxo-thieno[3,4-d]isothiazole-1,1-dione is used instead of 4,6-dibromo-N-octyl-2,3-dihydro-3-oxo-thieno[3,4-d]isothiazole-1,1-dione of the example 1, whereby a 0.962 g burgundy polymer having a metallic luster is obtained. Refining is performed by ethyl acetate, hexane, toluene, and chlorobenzene in the order mentioned by Soxhlet extraction. Thereafter, a benzene extraction component is used.

Regarding the obtained compound, NMR is evaluated. The evaluation result is "1H-NMR (270 MHz, CDCI3): partial 8.2-6.35 (broad), 3.9-3.45 (broad), 3.2-2,6 (broad), 2.4-0.6 (m)". In 6.35-8.2 ppm, a peak of an aromatic proton of a benzodithiophene ring and a thiophene ring of a side chain is observed, and in 3.4-3.9 ppm, a peak corresponding to $CH_2$ bonded to a nitrogen atom and a peak corresponding to $CH_2$ bonded to the thiophene ring of the side chain, and in 0.6-2.3 ppm, a peak corresponding to an alkyl group are all observed as broad peaks, and this compound is confirmed as being an intended polymer. Further, when a weight-average molecular weight and a UV-vis absorption spectrum are measured by the same methods as those previously described, the polystyrene-equivalent weight-average molecular weight is 55000 (Mw/Mn=2.6) and the maximum absorption peak (lambda max) is 617 nm.

Example 5

Synthesis of poly(3,3-dioctyl-2-2'-bithiophene-5,5'-diyl-alt-(N-heptyl-2,3-dihydro-3-oxo-thieno[3,4]-isothiazole-1,1-dione-4,6-diyl)) [P5]

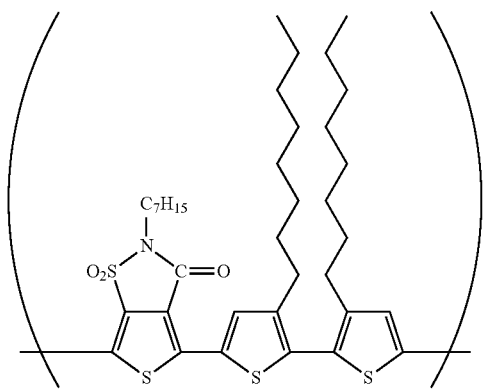

[P5]

The synthesis is performed under the same condition as that of the example 4 except in that 5,5'-bis(trimethyltin)-3,3'-dioctyl2-2'-bithiophene is used instead of 2,6-bis(trimethyltin)-4,8-bis(5-(2-ethylhexyl)thiophene-2-yl)benzo(1,2-b:4,5-b')dithiophene of the example 4, whereby a 0.724 g reddish-black polymer is obtained. Refining is performed by ethyl acetate, hexane, toluene, and chlorobenzene in the order mentioned by Soxhlet extraction. Thereafter, a benzene extraction component is used.

Regarding the obtained compound, NMR is evaluated. The evaluation result is "1H-NMR (270 MHz, CDCl3) partial: 8.2-6.8 (broad), 3.9-3.4 (broad), 3.2-2.4 (broad), 2.3-0.6 (m)". In partial 6.8-8.2 ppm, a peak of an aromatic proton of a thiophene ring is observed, and in 3.4-3.9 ppm, a peak corresponding to CH$_2$ bonded to a nitrogen atom, in 2.4-3.0 ppm, a peak corresponding to CH$_2$ bonded to the thiophene ring of a side chain, and in 0.6-2.3 ppm, a peak corresponding to an alkyl group are all observed as broad peaks, and this compound is confirmed as being an intended polymer. Further, when a weight-average molecular weight and a UV-vis absorption spectrum are measured by the same methods as those previously described, the polystyrene-equivalent weight-average molecular weight is 65000 (Mw/Mn=3.0) and the maximum absorption peak (lambda max) is 604 nm.

Example 6

Synthesis of poly(3-octyl-thiophene-2,5'-diyl-alt-(N-heptyl-2,3-dihydro-3-oxo-thieno[3,4-]isothiazole-1,1-dione-4,6-diyl)) [P6]

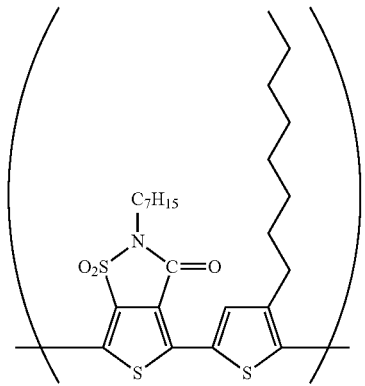

[P6]

The synthesis is performed under the same condition as that of the example 4 except in that 2,5-bis(trimethyltin)-3-octylthiophene is used instead of 2,6-bis(trimethyltin)-4,8-bis(5-(2-ethylhexyl)thiophene-2-yl)benzo(1,2-b:4,5-b')dithiophene of the example 4, whereby a 0.521 g reddish-black polymer is obtained. Refining is performed by ethyl acetate, hexane, toluene, and chlorobenzene in the order mentioned by Soxhlet extraction. Thereafter, a benzene extraction component is used.

Regarding the obtained compound, NMR is evaluated. The evaluation result is "1H-NMR (270 MHz, CDCl3) partial: 8.2-6.8 (broad), 3.9-3.4 (broad), 3-2.4 (broad), 2.3-0.6 (m)". In partial 6.8-8.2 ppm, a peak of an aromatic proton of a thiophene ring is observed, and in 3.4-3.9 ppm, a peak corresponding to CH$_2$ bonded to a nitrogen atom, in 2.4-3.0 ppm, a peak corresponding to CH$_2$ bonded to the thiophene ring of a side chain, and in 0.6-2.3 ppm, a peak corresponding to an alkyl group are all observed as broad peaks, and this compound is confirmed as being an intended polymer. Further, when a weight-average molecular weight and a UV-vis absorption spectrum are measured by the same methods as those previously described, the polystyrene-equivalent weight-average molecular weight is 81000 (Mw/Mn=3.2) and the maximum absorption peak (lambda max) is 586 nm.

Example 7

Synthesis of poly(thieno[3,2-b]thiophene-2,5-diyl-alt-(N-heptyl-2,3-dihydro-3-oxo-thieno[3,4-]isothiazole-1,1-dione-4,6-diyl)) [P7]

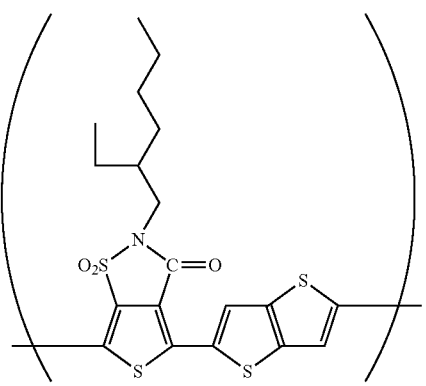

[P7]

The synthesis is performed under the same condition as that of the example 2 except in that 2,5-bis(trimethyltin)thieno[3,2-b]thiophene is used instead of 2,6-bis(trimethyltin)-4,8-bis(5-(2-ethylhexyl)thiophene-2-yl)benzo(1,2-b:4,5-b')dithiophene of the example 2, whereby a 0.451 g reddish-black polymer is obtained. Refining is performed by ethyl acetate, hexane, toluene, and chlorobenzene in the order mentioned by Soxhlet extraction. Thereafter, a benzene extraction component is used.

Regarding the obtained compound, NMR is evaluated. The evaluation result is "1H-NMR (270 MHz, CDCl3) partial: 8.2-6.8 (broad), 3.9-3.4 (broad), 3-2.4 (broad), 2.3-0.6 (m)". In partial 6.8-8.2 ppm, a peak of an aromatic proton of a dithiophene ring is observed, and in 3.4-3.9 ppm, a peak corresponding to CH$_2$ bonded to a nitrogen atom, and in 0.6-2.3 ppm, a peak corresponding to an alkyl group are all observed as broad peaks, and this compound is confirmed as being an intended polymer. Further, when a weight-average molecular weight and a UV-vis absorption spectrum are measured by the same methods as those previously described, the polystyrene-equivalent weight-average molecular weight is 81000 (Mw/Mn=3.2) and the maximum absorption peak (lambda max) is 586 nm.

Example 8

Synthesis of poly(4,4'-bis(2-ethylhexyl)dithieno[3,2-b:2', 3'-b]silole-2,6-diyl-alt-(N-heptyl-2,3-dihydro-3-oxo-thieno[3,4-]isothiazole-1,1-dione-4,6-diyl)) [P8]

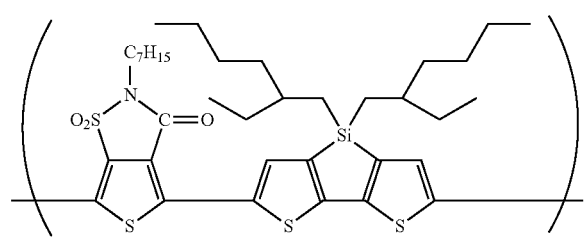

[P8]

The synthesis is performed under the same condition as that of the example 4 except in that 2,6'-bis(trimethyltin)-(4,4'-bis(2-ethylhexyl)dithieno[3,2-b:2',3'-b]silole is used instead of 2,6-bis(trimethyltin)-4,8-bis(5-(2-ethylhexyl) thiophene-2-yl)benzo(1,2-b:4,5-b')dithiophene of the example 4, whereby a 0.803 g slightly bluish copper-colored polymer having a metallic luster is obtained. Refining is performed by ethyl acetate, hexane, toluene, and chlorobenzene in the order mentioned by Soxhlet extraction. Thereafter, a benzene extraction component is used. 2,6'-bis (trimethyltin)-(4,4'-bis(2-ethylhexyl)dithieno[3,2-b:2',3'-b] silole is synthesized based on the description in Lijun Huo et al. Macromolecules 2009, VOL42, 6564-6571.

Regarding the obtained compound, NMR is evaluated. The evaluation result is "1H-NMR (270 MHz, CDCl3) partial: 8.15-6.95 (broad), 3.9-3.45 (broad), 2.4-0.5 (m)". In partial 6.95-8.15 ppm, a peak of an aromatic proton of a thiophene ring is observed, and in 3.45-3.9 ppm, a peak corresponding to $CH_2$ bonded to a nitrogen atom and in 0.6-2.3 ppm, a peak corresponding to an alkyl group are all observed as broad peaks, and this compound is confirmed as being an intended polymer. Further, when a weight-average molecular weight and a UV-vis absorption spectrum are measured by the same methods as those previously described, the polystyrene-equivalent weight-average molecular weight is 92000 (Mw/Mn=3.3) and the maximum absorption peak (lambda max) is 668 nm.

Example 9

Synthesis of poly(4,4'-bis(2-ethylhexyl)dithieno[3,2-b:2', 3'-b]germole-2,6-diyl-alt-(N-heptyl-2,3-dihydro-3-oxo-thieno[3,4-]isothiazole-1,1-dione-4,6-diyl)) [P9]

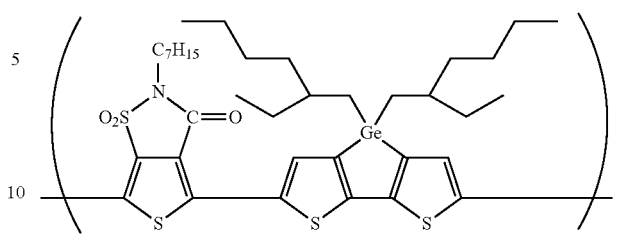

[P9]

The synthesis is performed under the same condition as that of the example 4 except in that 2,6'-bis(trimethyltin)-(4,4'-bis(2-ethylhexyl)dithieno[3,2-b:2',3'-b]germole is used instead of 2,6-bis(trimethyltin)-4,8-bis(5-(2-ethylhexyl) thiophene-2-yl)benzo(1,2-b:4,5-b')dithiophene of the example 4, whereby a 0.834 g copper-colored polymer having a metallic luster is obtained. Refining is performed by ethyl acetate, hexane, toluene, and chlorobenzene in the order mentioned by Soxhlet extraction. Thereafter, a benzene extraction component is used. 2,6'-bis(trimethyltin)-(4, 4'-bis(2-ethylhexyl)dithieno[3,2-b:2',3'-b]germole as synthesized based on the description in Chad m. Amb et al. J. Am. Chem. Soc 2011, VOL133, 10062-10065.

Regarding the obtained compound, NMR is evaluated. The evaluation result is "1H-NMR (270 MHz, CDCl3) partial: 8.2-6.9 (broad), 3.9-3.45 (broad), 2.3-0.5 (m)". In partial 6.9-8.2 ppm, a peak of an aromatic proton of a thiophene ring is observed, and in 3.45-3.9 ppm, a peak corresponding to $CH_2$ bonded to a nitrogen atom, and in 0.6-2.3 ppm, a peak corresponding to an alkyl group are all observed as broad peaks, and this compound is confirmed as being an intended polymer. Further, when a weight-average molecular weight and a UV-vis absorption spectrum are measured by the same methods as those previously described, the polystyrene-equivalent weight-average molecular weight is 42000 (Mw/Mn=2.8) and the maximum absorption peak (lambda max) is 678 nm.

Example 10

Synthesis of poly(4,4'-diethylhexyl-4H-cyclopenta[2,1-b: 3,4-b']dithiophene-2,6-diyl-alt-(N-(2-heptyl)-2,3-dihydro-3-oxo-thieno[3,4-]isothiazole-1,1-dione-4,6-diyl)) [P10]

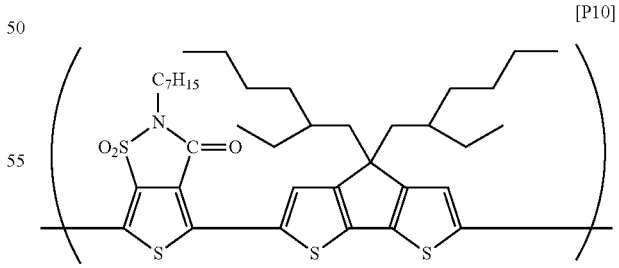

[P10]

The synthesis is performed under the same condition as that of the example 4 except in that 2,6-bis(trimethyltin)-4, 4'-diethylhexyl-4H-cyclopenta[2,1-b:3,4-b']dithiophene is used instead of 2,6-bis(trimethyltin)-4,8-bis(5-(2-ethyl-hexyl)thiophene-2-yl)benzo(1,2-b:4,5-b')dithiophene of the example 4, whereby a 0.611 g copper-colored polymer having a metallic luster is obtained. Refining is performed by ethyl acetate, hexane, toluene, and chlorobenzene in the order mentioned by Soxhlet extraction. Thereafter, a benzene extraction component is used. 2,6'-bis(trimethyltin)-4,4'-diethylhexyl-4H-cyclopenta[2,1-b:3,4-b']dithiophene is synthesized based on the description in Zhu, Z et al. Macromolecules 2007, vol. 40, 1981-1986.

Regarding the obtained compound, NMR is evaluated. The evaluation result is "1H-NMR (270 MHz, CDCl3) partial: 8.2-6.8 (broad), 3.9-3.4 (broad), 2.3-0.5 (m)". In partial 6.8-8.2 ppm, a peak of an aromatic proton of a thiophene ring is observed, and in 3.4-3.9 ppm, a peak corresponding to $CH_2$ bonded to a nitrogen atom, and in 0.6-2.3 ppm, a peak corresponding to an alkyl group are all observed as broad peaks, and this compound is confirmed as being an intended polymer. Further, when a weight-average molecular weight and a UV-vis absorption spectrum are measured by the same methods as those previously described, the polystyrene-equivalent weight-average molecular weight is 38000 (Mw/Mn=2.6) and the maximum absorption peak (lambda max) is 705 nm.

Example 11

Synthesis of poly(4,4'-bis(2-ethylhexyl)dithieno[3,2-b:2',3'-b]silole-2,6-diyl-alt-(N-(6-bromohexyl)-2,3-dihydro-3-oxo-thieno[3,4-]isothiazole-1,1-dione-4,6-diyl)) [P11]

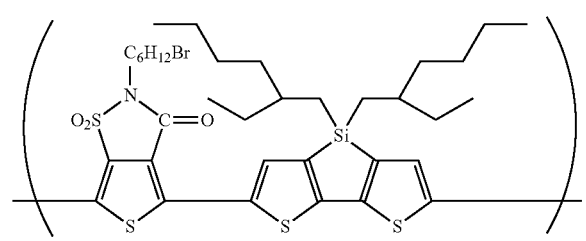

[P11]

The synthesis is performed under the same condition as that of the example 8 except in that 4,6-dibromo-N-(6-bromohexyl)-2,3-dihydro-3-oxo-thieno[3,4-d]isothiazole-1,1-dione is used instead of 4,6-dibromo-N-heptyl-2,3-dihydro-3-oxo-thieno[3,4-d]isothiazole-1,1-dione of the example 8, whereby a 0.812 g copper-colored polymer having a metallic luster is obtained. Refining is performed by ethyl acetate, hexane, toluene, and chlorobenzene in the order mentioned by Soxhlet extraction. Thereafter, a benzene extraction component is used.

Regarding the obtained compound, NMR is evaluated. The evaluation result is "1H-NMR (270 MHz, CDCl3) partial: 8.2-6.8 (broad), 3.85-3.2 (broad), 2.3-0.5 (m)". In partial 6.95-8.15 ppm, a peak of an aromatic proton of a thiophene ring is observed, and in 3.2-3.85 ppm, a peak corresponding to $CH_2$ in which bromine is bonded to $CH_2$ bonded to a nitrogen atom, and in 0.6-2.3 ppm, a peak corresponding to an alkyl group are all observed as broad peaks, and this compound is confirmed as being an intended polymer. Further, when a weight-average molecular weight and a UV-vis absorption spectrum are measured by the same methods as those previously described, the polystyrene-equivalent weight-average molecular weight is 48000 (Mw/Mn=2.8) and the maximum absorption peak (lambda max) is 672 nm.

Example 12

Synthesis of poly(4,8-bis(5-(2-ethylhexyl)thienyl)benzo[1,2-b:4,5-b']dithiophene-2,6-diyl-alt-(2,6-(5-thiophene-2-yl)-N-heptyl-2,3-dihydro-3-oxo-thieno[3,4-d]isothiazole-1,1-dione-4,6-diyl)) [P12]

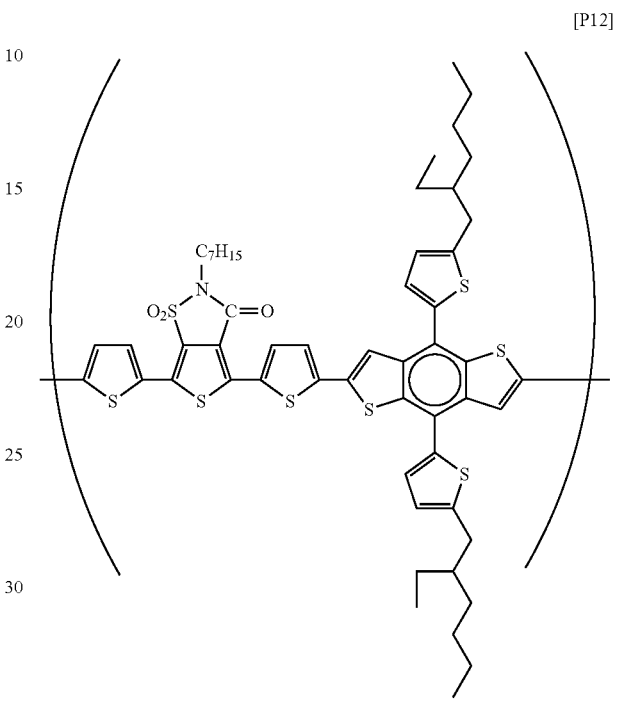

[P12]

The synthesis is performed under the same condition as that of the example 1 except in that 4,6-bis(5-bromothiophene-2-yl)-N-heptyl-2,3-dihydro-3-oxo-thieno[3,4-d]isothiazole-1,1-dione was used instead of 4,6-dibromo-N-octyl-2,3-dihydro-3-oxo-thieno[3,4-d]isothiazole-1,1-dione of the example 1, whereby a 1.012 g burgundy polymer having a metallic luster is obtained. Refining is performed by ethyl acetate, hexane, toluene, and chlorobenzene in the order mentioned by Soxhlet extraction. Thereafter, a benzene extraction component is used.

Regarding the obtained compound, NMR is evaluated. The evaluation result is "1H-NMR (270 MHz, CDCl3) partial: 8.2-6.5 (broad), 3.9-3.45 (broad), 3.2-2.6 (broad), 2.4-0.6 (m)". In partial 6.5-8.2 ppm, a peak of an aromatic proton of a benzodithiophene ring and a thiophene ring of a side chain is observed, and in 3.45-3.9 ppm, a peak corresponding to $CH_2$ bonded to a nitrogen atom, in 3.2-2.6 ppm, a peak corresponding to $CH_2$ bonded to the thiophene ring of the side chain, and in 0.6-2.3 ppm, a peak corresponding to an alkyl group are all observed as broad peaks, and this compound is confirmed as being an intended polymer. Further, when a weight-average molecular weight and a UV-vis absorption spectrum are measured by the same methods as those previously described, the polystyrene-equivalent weight-average molecular weight is 83000 (Mw/Mn=3.2) and the maximum absorption peak (lambda max) is 598 nm.

Comparative Example 1

With reference to the description in JP-A No. 2011-16874, 1,3-dibromo-N-octyl-thieno[3,4-C]pyrrole-4,6-dione is synthesized. A coupling reaction with 2,5-bis(tributyltin)thiophene is similarly performed, whereby a black solid is obtained.

Comparative Example 2

[CP2]

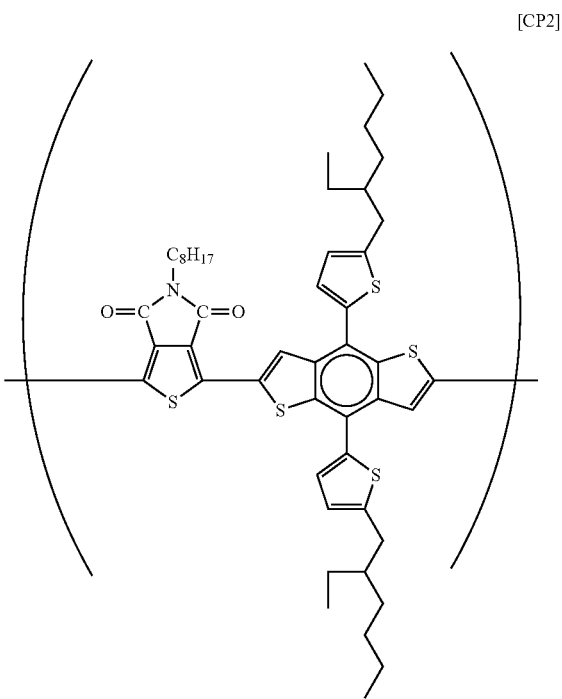

A polymer is synthesized in the same manner as that of the example 1 except in that 1,3-dibromo-N-octyl-thieno[3,4-C]pyrrole-4,6-dione is used instead of 4,6-dibromo-N-octyl-2,3-dihydro-3-oxo-thieno[3,4-d]isothiazole-1,1-dione, whereby a black brass-colored polymer having a metallic luster is obtained. Refining is performed by ethyl acetate, hexane, toluene, and chlorobenzene in the order mentioned by Soxhlet extraction. Thereafter, a benzene extraction component is used.

Regarding the obtained compound, NMR is evaluated. The evaluation result is "1H-NMR (270 MHz, CDCl3) partial: 8.2-6.35 (broad), 3.9-3.5 (broad), 3.2-2.6 (broad), 2.3-0.6 (m)". In partial 6.35-8.2 ppm, a peak of an aromatic proton of a benzodithiophene ring and a thiophene ring of a side chain is observed, and in 3.5-3.9 ppm, a peak corresponding to $CH_2$ bonded to a nitrogen atom and a peak corresponding to $CH_2$ bonded to the thiophene ring of the side chain, and in 0.6-2.3 ppm, a peak corresponding to an alkyl group are all observed as broad peaks, and this compound was confirmed as being an intended polymer. Further, when a weight-average molecular weight and a UV-vis absorption spectrum are measured by the same methods as those previously described, the polystyrene-equivalent weight-average molecular weight is 76000 (Mw/Mn=3.1) and the maximum absorption peak (lambda max) is 601 nm.

Examples 13 to 24, Comparative Examples 3 to 4

[Fabrication of Organic Thin-Film Solar Cell Elements]

The polymers (P1 to P12) of the examples 1 to 12 and the polymers of the comparative examples 1 to 2 being p-type semiconductor materials are mixed with PC70BM being an n-type semiconductor material so that their mass ratio to PC70BM became 1:2. Next, the mixtures are dissolved in chlorobenzene in a nitrogen atmosphere so that a concentration of each of the mixtures became 2.0 mass %. 1,8-diiodooctane is added so that its ratio became 3 mass % of each of the whole solutions, and the solutions are stirred and mixed at a 120 centigrade degrees temperature for one hour by using a hot stirrer. After the solutions having been stirred and mixed are cooled to room temperature, the solutions are filtrated by a 0.20 micron meter polytetrafluoroethylene (PTFE) filter, whereby active layer coating liquids using the respective polymers are obtained.

Glass substrates whose transparent conductive films of indium-tin oxide (ITO) are patterned are cleaned by ultrasonic cleaning by a surface-active agent, water washing by ultrapure water, and ultrasonic cleaning by ultrapure water in the order mentioned, thereafter are dried by nitrogen blowing, and are dried by five-minute heating at 120 centigrade degrees in the atmosphere. Finally, the substrates are cleaned by ultraviolet ozone. On each of the substrates, an aqueous dispersion (PH500 (trade name) manufactured by Heraeus) of poly(3,4-ethylenedioxythiophene)polystyrenesulfonic acid as a hole extraction layer is applied by spin coating, and the coated substrates are heated for five minutes on a 140 centigrade degrees hot plate in the atmosphere. A film thickness of the hole extraction layer is about 40 nm.

The substrates on each of which the hole extraction layer is formed were spin-coated with the respective active layer coating liquids of the polymers at a 600 rpm speed under a nitrogen atmosphere, whereby active layers with an about 90 nm thickness are formed. Thereafter, lithium fluoride whose average film thickness is 0.1 nm as an electron extraction layer and further aluminum with a 100 nm thickness as an electrode layer are sequentially formed by a vacuum vapor deposition method of a resistance heating type. In this manner, 1 cm square solar cell elements are fabricated.

[Evaluation of Organic Thin-Film Solar Cell Elements]

A 1 cm square metal mask is put on each of the fabricated solar cell elements, and by using, as a radiation light source, a SPECTR solar simulator IVP0605 (trade name) manufactured by Asahi Spectra Co., Ltd. whose air mass (AM) is 1.5 G and whose irradiance is 100 mW/cm$^2$, a current-voltage characteristic between an ITO electrode and an aluminum electrode is measured. Table 1 presents, as measurement results, open-circuit voltage (Voc), short-circuit current density (Jsc), fill factor (FF), and conversion efficiency.

TABLE 1

| | | Evaluation result of characteristic of organic thin-film solar cell | | | |
|---|---|---|---|---|---|
| | Polymer | Open-circuit voltage (Voc) [V] | Short-circuit current density (Jsc) [mA/cm$^2$] | Fill factor (FF) | Conversion efficiency (PCE) [%] |
| Example 13 | Example 1 [P1] | 0.96 | 6.3 | 0.55 | 3.3 |
| Example 14 | Example 2 [P2] | 0.98 | 5.5 | 0.53 | 2.9 |
| Example 15 | Example 3 [P3] | 0.93 | 6.4 | 0.57 | 3.4 |
| Example 16 | Example 4 [P4] | 0.96 | 6.2 | 0.57 | 3.4 |
| Example 17 | Example 5 [P5] | 0.95 | 5.8 | 0.51 | 2.8 |
| Example 18 | Example 6 [P6] | 0.90 | 3.0 | 0.50 | 1.3 |
| Example 19 | Example 7 [P7] | 0.93 | 6.0 | 0.52 | 2.9 |
| Example 20 | Example 8 [P8] | 0.99 | 10.2 | 0.56 | 5.7 |
| Example 21 | Example 9 [P9] | 0.97 | 11.1 | 0.57 | 6.1 |
| Example 22 | Example 10 [P10] | 0.93 | 10.8 | 0.56 | 5.6 |

TABLE 1-continued

| | | Evaluation result of characteristic of organic thin-film solar cell | | | |
|---|---|---|---|---|---|
| | Polymer | Open-circuit voltage (Voc) [V] | Short-circuit current density (Jsc) [mA/cm$^2$] | Fill factor (FF) | Conversion efficiency (PCE) [%] |
| Example 23 | Example 11 [P11] | 0.98 | 10.0 | 0.54 | 5.3 |
| Example 24 | Example 12 [P12] | 0.93 | 5.9 | 0.56 | 3.1 |
| Comparative Example 3 | Comparative Example 1 [CP1] | 0.80 | 3.1 | 0.45 | 1.1 |
| Comparative Example 4 | Comparative Example 2 [CP2] | 0.88 | 5.3 | 0.45 | 2.1 |

As is apparent from Table 1, it is seen that the solar cell elements using the polymers of the examples are high in the open-circuit voltage (Voc), namely, about 0.9 to 1.0 V and further are excellent in conversion efficiency (power generation efficiency), as compared with the comparative examples. Therefore, by using the polymers of the examples, it is possible to provide a high-performance organic thin-film solar cell.

Example 25

A glass substrate whose transparent conductive film of indium-tin oxide (ITO) is patterned is cleaned by ultrasonic cleaning by a surface-active agent, water washing by ultrapure water, and ultrasonic cleaning by ultrapure water in the order mentioned, thereafter is dried by nitrogen blowing, and is dried by five-minute heating at 120 centigrade degrees in the atmosphere. Finally, the substrate is cleaned by ultraviolet ozone. On this substrate, an aqueous dispersion of poly(3,4-ethylenedioxythiophene)polystyrenesulfonic acid (PH500 (trade name) manufactured by Heraeus) as a hole extraction layer is applied by spin coating, and the coated substrate is heated for five minutes on a 140 centigrade degrees hot plate in the atmosphere. A film thickness of the hole extraction layer is about 40 nm.

The substrate on which the hole extraction layer is formed is spin-coated with an active layer coating liquid of the polymer [P11] of the example 11 at a 600 rpm speed under a nitrogen atmosphere, whereby an active layer with an about 90 nm thickness is formed. Next, under an argon atmosphere, UV light (254 nm, 1.9 mW/cm$^2$) is radiated for 30 minutes for photocrosslinking. Thereafter, lithium fluoride whose average film thickness is 0.1 nm as an electron extraction layer and further aluminum with a 100 nm thickness as an electrode layer are sequentially formed by a vacuum vapor deposition method of a resistance heating type. In this manner, a 1 cm square solar cell element is fabricated. Separately, a solar cell element in which a polymer is not subjected to photocrosslinking is prepared.

1 cm square metal masks are put on the solar cell element in which the polymer is subjected to the photocrosslinking and the solar cell element in which the polymer is not subjected to the photocrosslinking respectively, and a fading test is conducted in conformity to C8938 of the JIS standard. By a radiation light source with 1.5 G air mass (AM) and a 100 mW/cm$^2$ irradiance, a temperature of a black panel is adjusted to 63 centigrade degrees, and the radiation is continued for 70 hours. By using SPECTRA solar simulator IVP0605 (trade name) manufactured by Asahi Spectra Co., Ltd., a current-voltage characteristic between an ITO electrode and an aluminum electrode is measured. Further, the solar cell element in which the polymer is subjected to the photocrosslinking and the solar cell element in which the polymer is not subjected to the photocrosslinking are heated at 100 centigrade degrees for 30 minutes in a nitrogen atmosphere, and thereafter their characteristics are measured in the same manner. Table 2 presents deterioration ratios of the characteristics before and after the light radiation and deterioration ratios of the characteristics before and after the heating. As is seen from Table 2, it is possible to improve light resistance and heat resistance by cross-linking the polymer.

TABLE 2

| | Deterioration ratio of characteristic of organic thin-film solar cell [%] | |
|---|---|---|
| Polymer | Deterioration ratio before and after light radiation | Deterioration ratio before and after heating (100 centigrade degrees × 30 min) |
| [P11] (without photocrosslinking) | 10 | 30 |
| [P11] (with photocrosslinking) | 4 | 10 |

[Fabrication of Organic/Inorganic Hybrid Solar Cell Element]

Examples 26 to 28

Lead iodide (PbI$_2$) and methylammonium iodide (CH$_3$NH$_4$I) are mixed at a molar ratio of 1:1, and this mixture is dissolved in dimethylformamide in a nitrogen atmosphere so that its concentration becomes 40 mass %. This resultant solution is stirred and mixed at a 120° C. temperature for 1 hour by using a hot stirrer. After the solution having been stirred and mixed is cooled to room temperature, the solution is filtrated by a 0.45 μm polytetrafluoroethylene (PTFE) filter, and thereby an active layer coating solution is obtained.

The polymers of Examples 1, 8 and 9 (P1, P8 and P9) being the p-type semiconductor materials are dissolved in chlorobenzene in a nitrogen atmosphere so that each concentration of the polymers becomes 1.0 mass %. These solutions are stirred and mixed at a 120° C. temperature for 1 hour by using a hot stirrer. After the solutions having been stirred and mixed are cooled to room temperature, the solutions are filtrated by a 0.20 μm PTFE filter, and thereby hole extraction layer coating solutions using the respective polymers are obtained.

Glass substrates whose transparent conductive films of fluorine-doped tin oxide (FTO) are patterned are cleaned by ultrasonic cleaning by a surface-active agent, water washing by ultrapure water, and ultrasonic cleaning by ultrapure water in the order mentioned, and thereafter are dried by nitrogen blowing, and are dried by five-minute heating at 120° C. in the atmosphere. Finally, the substrates are cleaned by ultraviolet ozone. Each of the substrates is spin-coated with an ethanol solution of titanium diisopropoxidebis (acetylacetone), and the coated substrates are heated for 30 minutes at 450° C. to then be cooled. These substrates are immersed in a titanium chloride (TiCl$_4$) aqueous solution for 30 minutes at 70° C. The substrates taken out from the aqueous solution are cleaned and dried, and then are heated at 500° C. for 20 minutes in the air, and thereby electron extraction layers with an about 20 nm thickness are formed.

The substrates on each of which the electron extraction layer is formed are spin-coated with an active layer coating solution of a perovskite compound at a 600 rpm speed under a nitrogen atmosphere and are dried at 60° C. for about 30 minutes, and thereby active layers with an about 300 nm thickness are formed. The active layers are spin-coated with the hole extraction layer coating solutions of the polymers respectively at a 2000 rpm speed for 60 seconds, and thereby hole extraction layers are formed. Thereafter, gold with a 100 nm thickness as an electrode layer is formed by a vacuum vapor deposition method of a resistance heating type. In this manner, 1 cm square organic/inorganic hybrid solar cell elements are fabricated.

Comparative Example 5

An organic/inorganic hybrid solar cell element is fabricated in the same manner as in Example 26 except that as a forming material of the hole extraction layer, poly(3-hexyl-thiophene-2,5-diyl) (P3HT) is used.

Comparative Example 6

An organic/inorganic hybrid solar cell element is fabricated in the same manner as in Example 26 except that the hole extraction layer is formed as follows. 180 mg of 2,2',7,7'-tetrakis(N,N-di-p-methoxyphenylamine)-9,9'-bifluorene(spiro-OMeTAD) is dissolved in 1 mL of dichlorobenzene. Into this resultant solution, 37.5 µL of a solution obtained by dissolving 170 mg of lithium bis(trifluoromethanesulfonyl)imide (Li-TFSI) in 1 mL of acetonitrile is added, and further, 17.5 µL of 4-t-butylpyridine is added, and thereby a hole extraction layer coating solution is fabricated. Spin-coating is performed with this hole extraction layer coating solution at a 3000 rpm speed for 30 seconds, and thereby a hole extraction layer is formed.

[Evaluation of Organic/Inorganic Hybrid Solar Cell Element]

A 1 cm square metal mask is put on each of the organic/inorganic hybrid solar cell elements, and by using, as a radiation light source, a SPECTR solar simulator IVP0605 (trade name) manufactured by Asahi Spectra Co., Ltd. whose air mass (AM) is 1.5 G and whose irradiance is 100 mW/cm², a current-voltage characteristic between an FTO electrode and an Au electrode is measured. Table 2 presents, as measurement results, open-circuit voltage (Voc), short-circuit current density (Jsc), fill factor (FF), and conversion efficiency. Further, the organic/inorganic hybrid solar cell elements are each encapsulated by a glass to be heated at 90° C. for 15 minutes on a hot plate in a nitrogen atmosphere, and then are cooled down to room temperature. The same characteristics are measured after the heating test to find deterioration ratios. Table 2 presents deterioration ratio of the characteristics before and after the heating.

TABLE 3

| | | Evaluation result of characteristic of organic/inorganic hybrid solar cell | | | | |
|---|---|---|---|---|---|---|
| | Polymer | Open-circuit voltage (Voc) [V] | Short-circuit current density (Jsc) [mA/cm²] | Fill factor (FF) | Conversion efficiency (PCE) [%] | Deterioration ratio [%] |
| E 26 | E 1 [P1] | 0.81 | 8.7 | 0.57 | 4.02 | 3 |
| E 27 | E 8 [P8] | 0.79 | 12.1 | 0.53 | 5.07 | 2 |
| E 28 | E 9 [P9] | 0.77 | 12.3 | 0.54 | 5.11 | 4 |
| CE 5 | P3HT | 0.50 | 10.5 | 0.65 | 3.41 | 4 |
| CE 6 | Spiro-OMeTAD + Li-TFSI | 0.93 | 18.3 | 0.64 | 10.89 | 75 |

E: Example, CE: Comparative Example

As is apparent from Table 3, it is seen that the organic/inorganic hybrid solar cell elements using the polymers of Examples are excellent in conversion efficiency (power generation efficiency) and heat resistance. Accordingly, by using the polymers of Examples, it becomes possible to provide a high-performance and longer lasting organic/inorganic hybrid solar cell.

While certain embodiments have been described, these embodiments have been presented by way of example only, and are not intended to limit the scope of the inventions. These novel embodiments may be embodied in a variety of other forms, and various omissions, substitutions and changes may be made without departing from the spirit of the inventions. These embodiments or modifications thereof are included in the scope and spirit of the inventions and included in the inventions described in the claims and their equivalents.

What is claimed is:
1. A polymer comprising a recurring unit of formula (6),

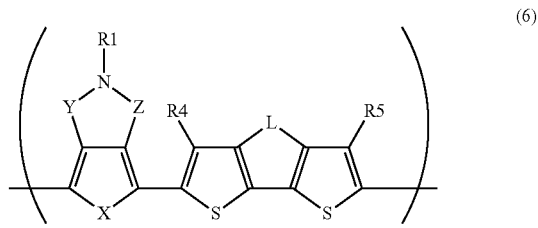

wherein R1 group, R4 group, and R5 group are each independently a monovalent group selected from the group consisting of hydrogen, a substituted or unsubstituted alkyl group, a substituted or unsubstituted alkanoyl group, a substituted or unsubstituted aryl group, and a substituted or unsubstituted heteroaryl group, X is sulfur, one of Y and Z is a carbonyl group and the other of Y and Z is a sulfonyl group, and L is one selected from the group consisting of oxygen, sulfur, a substituted imino group, a substituted methylene group, a substituted silylene group, and a substituted germirene group, wherein a weight-average molecular weight of the polymer is within a range of not less than 3000 nor more than 1000000.

2. The polymer according to claim 1, wherein a cross-linking group is provided as a terminal group in the polymer.

3. The polymer according to claim 1, wherein at least one selected from the R1 group, the R4 group, and the R5 group is a cross-linking group.

4. A solar cell comprising the polymer according to claim 1.

5. A solar cell, comprising:
a first electrode;
a second electrode; and
an photoelectric conversion layer, disposed between the first electrode and the second electrode, including an organic material,
wherein the organic material contains the polymer according to claim 1.

6. The solar cell according to claim 5, wherein the photoelectric conversion layer has an active layer containing the polymer.

7. The solar cell according to claim 5, wherein the photoelectric conversion layer has a buffer layer containing the polymer.

8. The polymer according to claim 1, wherein the L is one selected from the group consisting of oxygen, sulfur, a substituted imino group, a substituted methylene group, and a substituted germirene group.

9. The polymer according to claim 1, wherein the L is one selected from the group consisting of a substituted methylene group and a substituted germirene group.

* * * * *